(12) United States Patent
Hsieh et al.

(10) Patent No.: US 10,879,391 B2
(45) Date of Patent: Dec. 29, 2020

(54) WAKEUP-FREE FERROELECTRIC MEMORY DEVICE

(71) Applicant: Taiwan Semiconductor Manufacturing Co., Ltd., Hsin-Chu (TW)

(72) Inventors: Mickey Hsieh, Hsin-Chu (TW); Chun-Yang Tsai, Hsinchu (TW); Kuo-Ching Huang, Hsinchu (TW); Kuo-Chi Tu, Hsin-Chu (TW); Pili Huang, Hsin-Chu (TW); Cheng-Jun Wu, Hsin-Chu (TW); Chao-Yang Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/405,058

(22) Filed: May 7, 2019

(65) Prior Publication Data

US 2020/0357927 A1 Nov. 12, 2020

(51) Int. Cl.
*H01L 29/78* (2006.01)
*H01L 27/11507* (2017.01)
(Continued)

(52) U.S. Cl.
CPC .... *H01L 29/78391* (2014.09); *H01L 27/1159* (2013.01); *H01L 27/11507* (2013.01);
(Continued)

(58) Field of Classification Search
CPC .......... H01L 27/11507; H01L 27/1159; H01L 28/40; H01L 29/40111; H01L 29/516;
(Continued)

(56) References Cited

U.S. PATENT DOCUMENTS

2002/0190274 A1* 12/2002 Lung ................. H01L 27/11585
257/200
2009/0040808 A1* 2/2009 Krieger ............. H01L 29/40111
365/145
(Continued)

OTHER PUBLICATIONS

Allred, A.L. "Electronegativity Values From Thermochemical Data." J. Inorg. Nucl. Chem., 1961, vol. 17. pp. 215 to 221. Published in 1960.
(Continued)

*Primary Examiner* — Allan R Wilson
(74) *Attorney, Agent, or Firm* — Eschweiler & Potashnik, LLC

(57) ABSTRACT

Various embodiments of the present disclosure are directed towards a ferroelectric memory device. The ferroelectric memory device includes a pair of source/drain regions disposed in a semiconductor substrate. A gate dielectric is disposed over the semiconductor substrate and between the source/drain regions. A first conductive structure is disposed on the gate dielectric. A ferroelectric structure is disposed on the first conductive structure. A second conductive structure is disposed on the ferroelectric structure, where both the first conductive structure and the second conductive structure have an overall electronegativity that is greater than or equal to an overall electronegativity of the ferroelectric structure.

20 Claims, 13 Drawing Sheets

(51) Int. Cl.
  *H01L 49/02* (2006.01)
  *H01L 29/66* (2006.01)
  *H01L 29/51* (2006.01)
  *H01L 27/1159* (2017.01)
  *H01L 21/28* (2006.01)

(52) U.S. Cl.
  CPC ........ *H01L 28/40* (2013.01); *H01L 29/40111* (2019.08); *H01L 29/516* (2013.01); *H01L 29/6684* (2013.01); *H01L 29/66545* (2013.01)

(58) Field of Classification Search
  CPC ........... H01L 29/66545; H01L 29/6684; H01L 29/78391
  See application file for complete search history.

(56) References Cited

U.S. PATENT DOCUMENTS

2009/0200618 A1* 8/2009 Boescke ............. H01L 29/7833
   257/407
2017/0309488 A1* 10/2017 Sakai ................ H01L 29/78391

OTHER PUBLICATIONS

Huheey et al. "Inorganic Chemistry: Principals of Structure and Reactivity." Chapter by Allred, A.L. "Electronegativity Values From Thermochemical Data." Published in 1993.

* cited by examiner

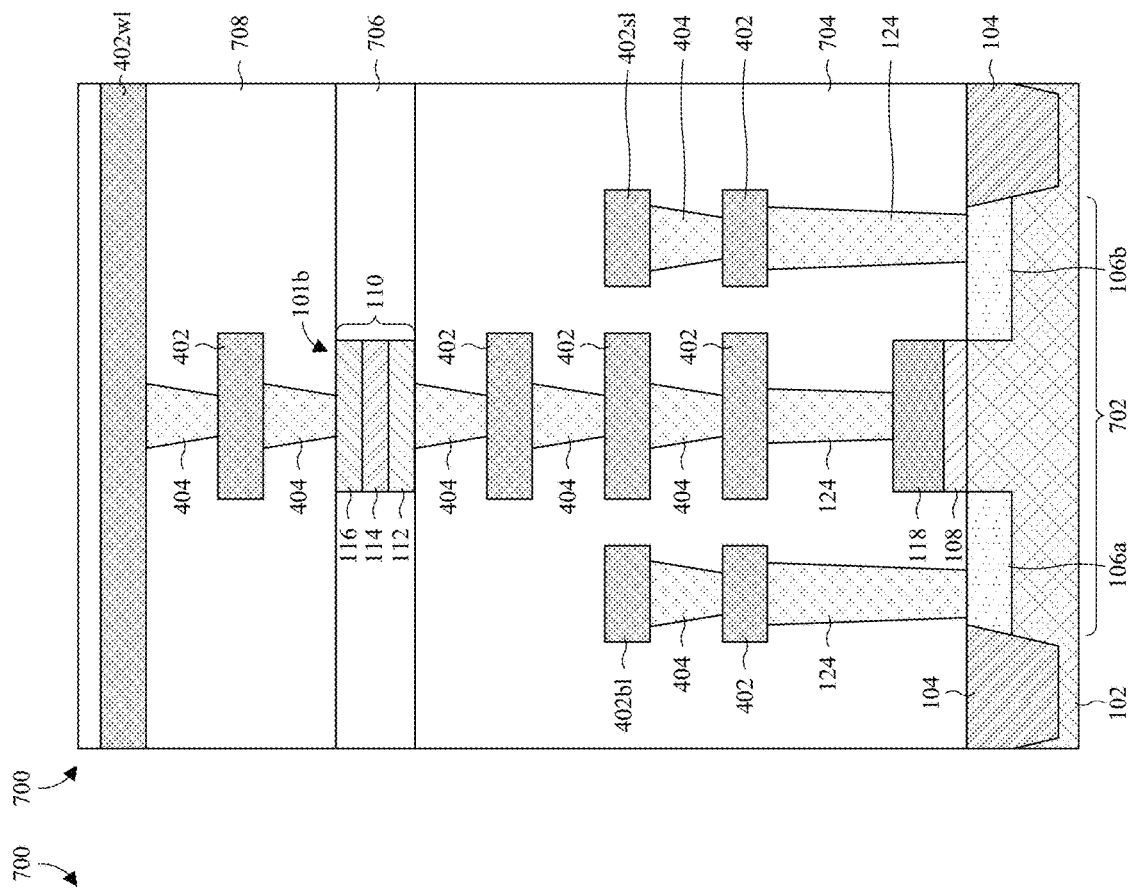
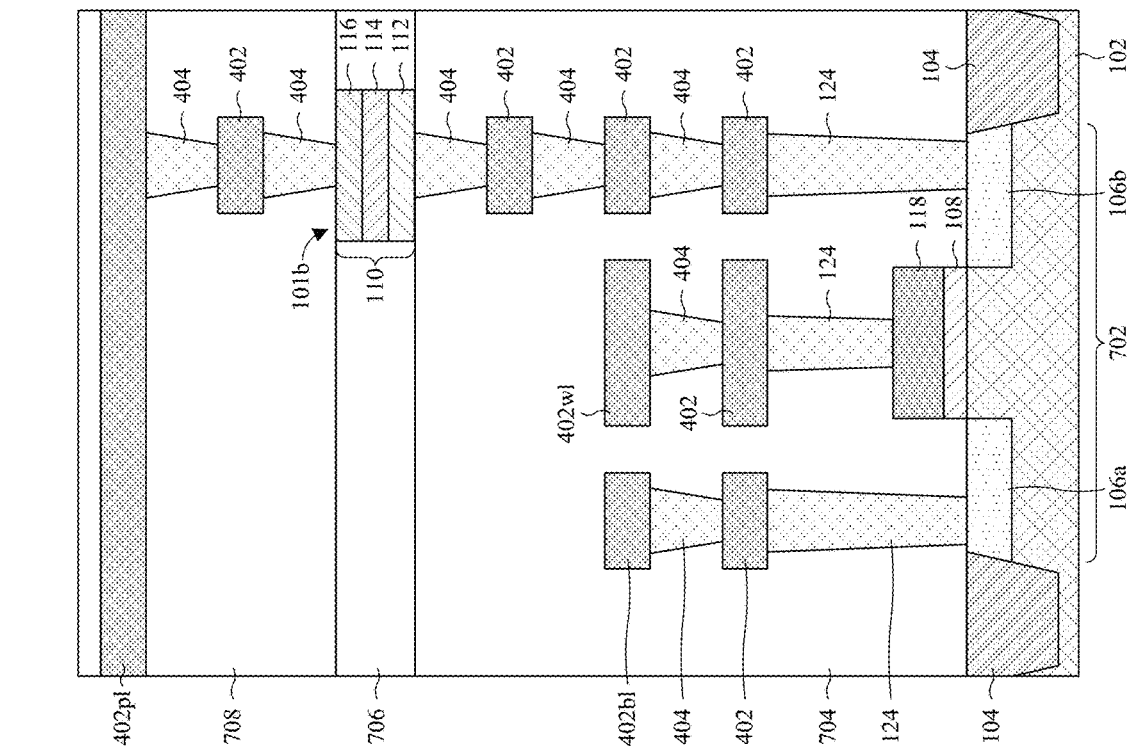

WAKEUP-FREE FERROELECTRIC MEMORY DEVICE

BACKGROUND

Many modern day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 illustrates a cross-sectional view of some embodiments of a second IC comprising a second wakeup-free ferroelectric memory device.

FIG. 8 illustrates a cross-sectional view of some other embodiments of the second IC of FIG. 7.

DETAILED DESCRIPTION

Figure 1:
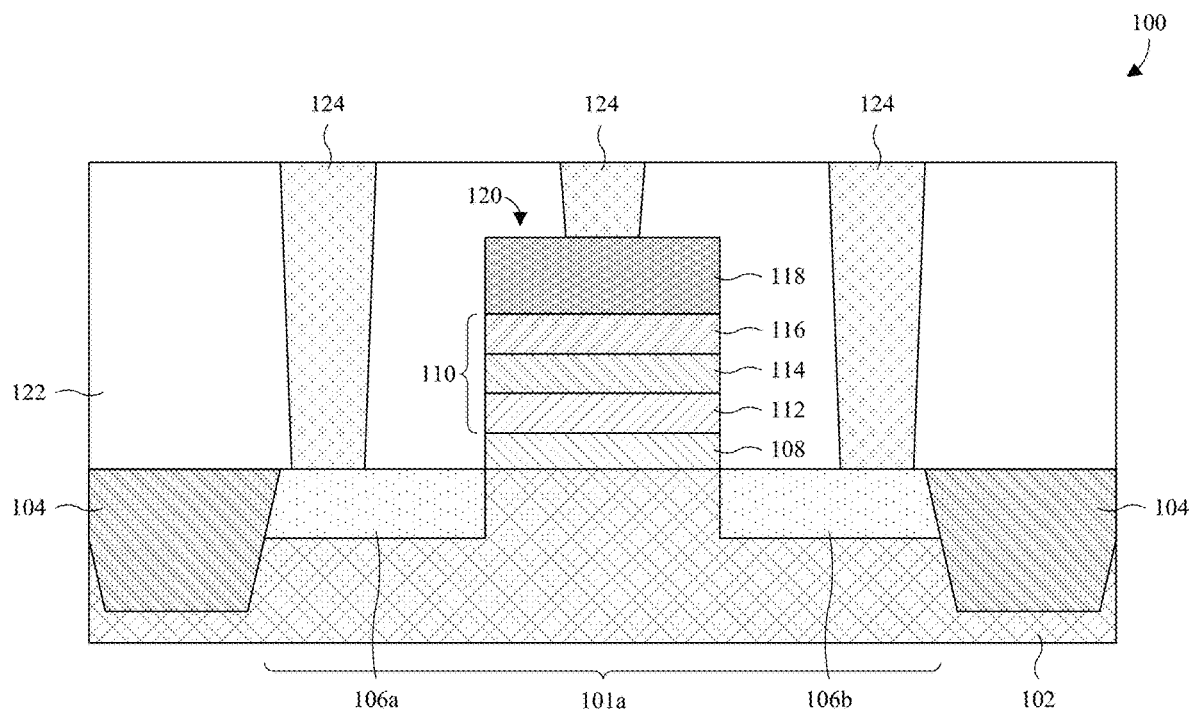
FIG. 1 illustrates a cross-sectional view of some embodiments of a first integrated chip (IC) comprising a first wakeup-free ferroelectric memory device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some ferroelectric memory (e.g., ferroelectric random-access memory (FeRAM)) comprises a ferroelectric memory cell. The ferroelectric memory cell comprises a ferroelectric structure disposed between a first electrode and a second electrode. In other embodiments, the ferroelectric structure may be disposed between a gate electrode and a semiconductor substrate (e.g., ferroelectric field-effect transistor (FeFET). The ferroelectric structure is configured to switch between polarization states to store data (e.g., binary "0" and "1"). The ferroelectric memory is often disposed on an integrated chip (IC) comprising other types of semiconductor devices (e.g., metal-oxide semiconductor field-effect transistors (MOSFETs), bipolar junction transistors (BJTs), high-electron-mobility transistors (HEMTs), etc.).

A challenge with the above ferroelectric memory is a need to perform a wakeup procedure on the ferroelectric memory cell to improve the memory window of the ferroelectric memory cell. For example, after the ferroelectric memory cell has been off (e.g., disconnected from power) for a given time period, the memory window of the ferroelectric memory cell may degrade to an unsatisfactory condition. Therefore, each time the ferroelectric memory cell is turned on, the wakeup procedure needs to be performed to improve the memory window of the ferroelectric memory cell, such that the ferroelectric memory cell may function properly (e.g., read, write, erase). The wakeup procedure comprises providing a plurality of voltage pulses, which may consist of different voltage amplitudes and pulse widths, to the ferroelectric memory cell.

In order to perform the wakeup procedure, wakeup circuitry is disposed on the IC to provide the voltage pulses to the ferroelectric memory cell. The wakeup procedure may negatively affect performance of the ferroelectric memory due to the wakeup procedure increasing power consumption of ferroelectric memory. Further, the wakeup circuitry takes up space on the IC that may be utilized to increase the density/number of ferroelectric memory cells.

In some embodiments, the present disclosure relates to a wakeup-free ferroelectric memory device. The wakeup-free ferroelectric memory device comprises a polarization switching structure. The polarization switching structure comprises a ferroelectric structure disposed between a first conductive structure and a second conductive structure. Both the first conductive structure and the second conductive structure have an overall electronegativity that is greater than or equal to an overall electronegativity of the ferroelectric structure. Because the overall electronegativity of both the first conductive structure and the second conductive structure are greater than the overall electronegativity of the ferroelectric structure, a wakeup procedure is not required to improve a memory window of the wakeup-free ferroelectric memory device. For example, because the overall electronegativity of both the first conductive structure and the second conductive structure are greater than the overall electronegativity of the ferroelectric structure, the memory window of the wakeup-free ferroelectric memory device may not degrade to an unsatisfactory condition after power has been removed from the polarization switching structure. In other words, the wakeup-free ferroelectric memory device does not require a wakeup procedure to improve the memory window of the wakeup-free ferroelectric memory device to function properly (e.g., read, write, erase). Accordingly, compared to non-wakeup-free ferroelectric memory, the wakeup-free ferroelectric memory may consume less power and/or have a greater number (or density) of ferroelectric memory devices on a given IC.

FIG. 1 illustrates a cross-sectional view of some embodiments of a first integrated chip (IC) 100 comprising a first wakeup-free ferroelectric memory device 101a. In some embodiments, the first wakeup-free ferroelectric memory device 101a illustrated in FIG. 1 may be referred to as a wakeup-free ferroelectric field-effect transistor (FeFET) and/or a front-end-of-line wakeup-free ferroelectric memory device. In further embodiments, the first wakeup-free ferroelectric memory device 101a may be part of a random-access memory (RAM) device (e.g., ferroelectric random-access memory (FeRAM) device). It will be appreciated that, in some embodiments, the first wake-up free ferroelectric memory device 101a of FIG. 1 could be realized in a fin type design (e.g., FinFET type design). It will further be appreciated that, in some embodiments, the first IC 100 may comprise a plurality of first wakeup-free ferroelectric memory devices 101a disposed in an array.

As shown in FIG. 1, the first IC 100 comprises an isolation structure 104 disposed in a semiconductor substrate 102. A pair of source/drain regions 106a-b are disposed in the semiconductor substrate 102 and spaced apart. A device gate stack 120 is disposed over the semiconductor substrate 102 and between the source/drain regions 106a-b. In some embodiments, the first wakeup-free ferroelectric memory device 101a comprises the device gate stack 120 and the source/drain regions 106a-b. An interlayer dielectric (ILD) structure 122 is disposed over the semiconductor substrate 102 and the device gate stack 120. A plurality of conductive contacts 124 are disposed in the ILD structure 122. The conductive contacts 124 extend through the ILD structure 122 to contact the source/drain regions 106a-b and the device gate stack 120, respectively.

In some embodiments, the device gate stack 120 comprises a gate dielectric 108 disposed on the semiconductor substrate 102. A polarization switching structure 110 is disposed between the gate dielectric 108 and a gate electrode 118. The polarization switching structure 110 is configured to store a bit of data. For example, the polarization switching structure 110 may switch between a first polarization state (e.g., negative remnant (−Pr) polarization state), which corresponds to a binary value of "1," and a second polarization state (e.g., positive remnant (+Pr) polarization state), which corresponds to a binary value of "0," or vice versa. In some embodiments, a positive voltage pulse is applied to the gate electrode 118 to switch to the first polarization state, and a negative voltage pulse is applied to the gate electrode 118 to switch to the second polarization state, or vice versa.

The polarization switching structure 110 comprises a ferroelectric structure 114 disposed between a first conductive structure 112 and a second conductive structure 116. The first conductive structure 112 has an overall electronegativity that is greater than or equal to an overall electronegativity of the ferroelectric structure 114. The second conductive structure 116 has an overall electronegativity that is greater than or equal to the overall electronegativity of the ferroelectric structure 114. More specifically, both the overall electronegativity of the first conductive structure 112 and the overall electronegativity of the second conductive structure 116 are greater than or equal to the overall electronegativity of the ferroelectric structure 114.

"Overall electronegativity" ($X_{compound\ (or\ element)}$) is based on the chemical composition of a compound (or element), percent of atoms of the chemical composition, and the electronegativity of the element(s) by the Pauling scale. An equation to determine the overall electronegativity of a generic compound ($A_xB_y \ldots N_z$) is provided below:

$$X_{A_xB_y\ldots N_z} = X_{rA}\frac{x}{x+y+\ldots z} + X_{rB}\frac{x}{x+y+\ldots z} + \ldots X_{rN}\frac{z}{x+y+\ldots z}$$

where $X_{A_xB_y\ldots N_z}$ is the overall electronegativity of compound $A_xB_y \ldots N_z$, A is a first element, B is a second element, N is an Nth element, $X_{rA}$ is the electronegativity of the first element by the Pauling scale, $X_{rB}$ is the electronegativity of the second element by the Pauling scale, $X_{rN}$ is the electronegativity of the Nth element by the Pauling scale, x is the number atoms of the first element in compound $A_xB_y \ldots N_z$, y is the number of atoms of the second element in compound $A_xB_y \ldots N_z$, and z is the number of atoms of the first element in compound $A_xB_y \ldots N_z$.

Some non-limiting examples are provided below illustrating the calculation of "overall electronegativity" for a variety of elements/compounds.

Example 1—Overall Electronegativity of Tungsten ($X_W$)

Electronegativity of W by Pauling Scale ($X_{rW}$)—2.36

$$X_W = X_{rW}\frac{1}{1}$$

$X_W$=2.36

Example 2—Overall Electronegativity of Hafnium Oxide ($X_{HfO_2}$)

Electronegativity of Hf by Pauling scale ($X_{rHf}$)—1.3
Electronegativity of O by Pauling scale ($X_{rO}$)—3.44

$$X_{HfO_2} = X_{rHf}\frac{1}{1+2} + X_{rO}\frac{2}{1+2}$$

$$X_{HfO} = 1.3\left(\frac{1}{3}\right) + 3.44\left(\frac{2}{3}\right)$$

$$X_{HfO_2} = 2.72$$

Example 3—Overall Electronegativity of Hafnium-Zirconium-Oxide ($X_{HfZrO4}$)

Electronegativity of Hf by Pauling scale ($X_{rHf}$)-1.3
Electronegativity of Zr by Pauling Scale ($X_{rZr}$)-1.33

Electronegativity of O by Pauling scale $(X_{rO})$-3.44

$$X_{HfO_2} = X_{rHf}\frac{1}{1+1+4} + X_{rZr}\frac{1}{1+1+4} + X_{rO}\frac{4}{1+1+4}$$

$$X_{HfZrO_2} = 1.3\left(\frac{1}{6}\right) + 1.33\left(\frac{1}{6}\right) + 3.44\left(\frac{4}{6}\right)$$

$$X_{HfZrO_2} = 2.73$$

Because the overall electronegativity of the first conductive structure 112 and the overall electronegativity of the second conductive structure 116 are greater than or equal to the overall electronegativity of the ferroelectric structure 114, a memory window of the first wakeup-free ferroelectric memory device 101a may not degrade to an unsatisfactory condition after power has been removed from the polarization switching structure 110. In other words, the first wakeup-free ferroelectric memory device 101a does not require a wakeup procedure to improve the memory window of the first wakeup-free ferroelectric memory device 101a to function properly (e.g., read, write, erase). Accordingly, compared to non-wakeup-free ferroelectric memory, the first wakeup-free ferroelectric memory device 101a may consume less power and/or the first IC 100 may comprise a greater number (or have a greater density) of the first wakeup-free ferroelectric memory devices 101a.

Figure 2:
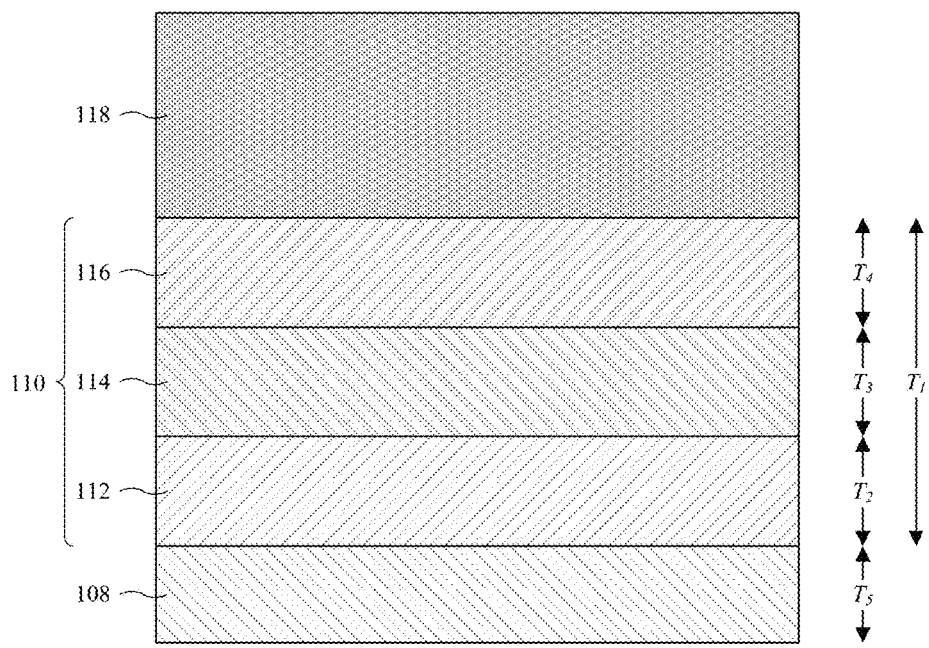
FIG. 2 illustrates a magnified cross-sectional view of some embodiments of the device gate stack of FIG. 1.

FIG. 2 illustrates a magnified cross-sectional view of some embodiments of the device gate stack 120 of FIG. 1.

The gate electrode 118 may comprise, for example, doped polysilicon (e.g., n-type/p-type polysilicon), a metal (e.g., tungsten (W), aluminum (Al), titanium (Ti), molybdenum (Mo), nickel silicide (NiSi), or the like), some other conductive material, or a combination of the foregoing. In some embodiments, a capping structure (not shown) (e.g., titanium nitride (TiN), tantalum nitride (TaN), or the like) may be disposed between the gate electrode 118 and the second conductive structure 116. In further embodiments, the gate electrode 118 and/or the capping structure has an overall electronegativity that is less than the overall electronegativity of the ferroelectric structure 114. In yet further embodiments, when the gate electrode 118 comprises a metal, the gate electrode 118 (and the capping structure) may be referred to as a metal gate electrode.

In some embodiments, the gate dielectric 108 may comprise, for example, an oxide (e.g., silicon dioxide ($SiO_2$)), a high-k dielectric material (e.g., hafnium oxide ($HfO_2$), zirconium oxide ($ZrO_2$), or some other dielectric material with a dielectric constant greater than about 3.9), some other dielectric material, or a combination of the foregoing. In further embodiments, an overall electronegativity of the gate dielectric 108 is less than the overall electronegativity of the ferroelectric structure 114.

In some embodiments, the first conductive structure 112 may comprise, for example, a metal (e.g., aluminum (Al), titanium (Ti), tantalum (Ta), gold (Au), platinum (Pt), tungsten (W), nickel (Ni), iridium (Jr), etc.), a metal-nitride (e.g., titanium nitride (TiN), tantalum nitride (TaN), etc.), a metal-oxide (e.g., iridium oxide ($IrO_2$)), doped polysilicon (e.g., n-type/p-type polysilicon), or the like. In further embodiments, the ferroelectric structure 114 may comprise one or more layers of, for example, a metal-oxide (e.g., hafnium oxide ($Hf_XO_Y$)), a component-metal-oxide (e.g., hafnium-silicon-oxide ($Hf_XSi_YO_Z$), hafnium-aluminum-oxide ($Hf_XAl_YO_Z$), hafnium-gadolinium-oxide ($Hf_XGd_YO_Z$), hafnium-zirconium-oxide ($Hf_XZr_YO_Z$), hafnium-lanthanum-oxide ($Hf_XLa_YO_Z$), hafnium-strontium-oxide ($Hf_XSr_YO_Z$), hafnium-yttrium-oxide ($Hf_XY_YO_Z$), strontium titanate (STO), etc.), a metal-oxynitride (e.g., hafnium oxynitride ($Hf_XO_YN_Z$)), or the like. In yet further embodiments, the second conductive structure 116 may comprise, for example, a metal (e.g., Al, Ti, Ta, Au, Pt, W, Ni, Jr, etc.), a metal-nitride (e.g., TiN, TaN, etc.), a metal-oxide (e.g., $IrO_2$), doped polysilicon (e.g., n-type/p-type polysilicon), or the like.

The first conductive structure 112 and the second conductive structure 116 may have a same chemical composition. In other embodiments, the chemical composition of the first conductive structure 112 may be different than the chemical composition of the second conductive structure 116. The overall electronegativity of the first conductive structure 112 may be greater than the overall electronegativity of the gate dielectric 108. In further embodiments, the overall electronegativity of the second conductive structure 116 may be greater than the overall electronegativity of the gate electrode 118 (or the capping structure).

In some embodiments, the first conductive structure 112 contacts both the gate dielectric 108 and the ferroelectric structure 114, the second conductive structure 116 contacts both the ferroelectric structure 114 and the gate electrode 118, and the gate electrode 118 contacts one of the conductive contacts 124. In further embodiments, sidewalls of the gate dielectric 108, sidewalls of the first conductive structure 112, sidewalls of the ferroelectric structure 114, sidewalls of the second conductive structure 116, and sidewalls of the gate electrode 118 may be substantially aligned in a vertical direction. In such embodiments, an area (e.g. length (across the page of FIG. 2) times width (into/out of the page of FIG. 2)) of the gate dielectric 108, an area of the first conductive structure 112, an area of the ferroelectric structure 114, an area of the second conductive structure 116, and an area of the gate electrode 118 may be substantially the same. In other embodiments, the sidewalls of the first conductive structure 112 may be disposed between the sidewalls of the gate dielectric 108, the sidewalls of the ferroelectric structure 114 may be disposed between the sidewalls of the first conductive structure 112, the sidewalls of the second conductive structure 116 may be disposed between the sidewalls of the ferroelectric structure 114, and/or the sidewalls of the gate electrode 118 may be disposed between the sidewalls of the second conductive structure 116. In such embodiments, the area of the first conductive structure 112 may be less than the area of the gate dielectric 108, the area of the ferroelectric structure 114 may be less than the area of the first conductive structure 112, the area of the second conductive structure 116 may be less than the area of the ferroelectric structure 114, and/or the area of the gate electrode 118 may be less than the area of the second conductive structure 116.

In some embodiments, the area of the gate dielectric 108 may be between about 1 square nanometer ($nm^2$) and about 100 square micrometers ($um^2$). In further embodiments, an area of the polarization switching structure 110 is between about 1 $nm^2$ and about 100 $um^2$. In yet further embodiments, the area of the gate dielectric 108 may be substantially the same as the area of the polarization switching structure 110. In other embodiments, the area of the gate dielectric 108 may be different than the area of the polarization switching structure 110.

The polarization switching structure 110 has a first thickness $T_1$. In some embodiments, the first thickness $T_1$ is between about 1.2 nanometer (nm) and about 2,100 nm. The first conductive structure 112 has a second thickness $T_2$. The second thickness $T_2$ may be between about 0.1 nm and about 1,000 nm. The ferroelectric structure 114 has a third thickness $T_3$. In some embodiments, the third thickness is between about 1 nm and about 100 nm. The second conductive structure 116 has a fourth thickness $T_4$. The fourth thickness $T_4$ may be between about 0.1 nm and about 1,000 nm. The gate dielectric 108 has a fifth thickness $T_5$. In further embodiments, a ratio between the first thickness $T_1$ and the fifth thickness $T_5$ (e.g., $T_1$ divided by $T_2$) is between about 100/1 and about 1/1.

In some embodiments, the second thickness $T_2$, the third thickness $T_3$, and the fourth thickness $T_4$ are substantially the same. In further embodiments, the second thickness $T_2$ and the fourth thickness $T_4$ may be substantially the same, while the third thickness $T_3$ differs. In further embodiments, the second thickness $T_2$ (or the fourth thickness $T_4$) and the third thickness $T_3$ may be substantially the same, while the fourth thickness $T_4$ (or the second thickness $T_2$) differs. In yet further embodiments, the second thickness $T_2$, the third thickness $T_3$, and the fourth thickness $T_4$ may differ from one another.

Figure 3:
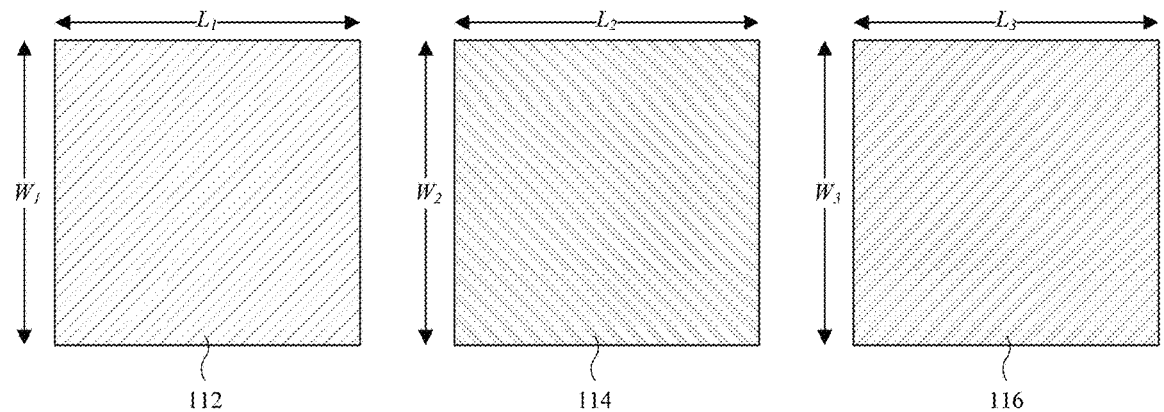
FIG. 3 illustrates a top view of some embodiments of the first conductive structure, the ferroelectric structure, and the second conductive structure removed from their stacked orientation in FIG. 1 and disposed next to one another.

FIG. 3 illustrates a top view of some embodiments of the first conductive structure 112, the ferroelectric structure 114, and the second conductive structure 116 removed from their stacked orientation in FIG. 1 and disposed next to one another.

As shown in FIG. 3, the first conductive structure 112 has a first length $L_1$ and a first width $W_1$. In some embodiments, the first length $L_1$ may be between about 1 nm and about 10 micrometers (um). In further embodiments, the first width $W_1$ may be between about 1 nm and about 10 um. In yet further embodiments, the area (e.g., $L_1$ times $W_1$) of the first conductive structure 112 is between about 1 $nm^2$ and about 100 $um^2$.

The ferroelectric structure 114 has a second length $L_2$ and a second width $W_2$. In some embodiments, the second length $L_2$ may be between about 1 nm and about 10 um. In further embodiments, the second width $W_2$ may be between about 1 nm and about 10 um. In yet further embodiments, the area (e.g., $L_2$ times $W_2$) of the ferroelectric structure 114 is between about 1 $nm^2$ and about 100 $um^2$.

The second conductive structure 116 has a third length $L_3$ and a third width $W_3$. In some embodiments, the third length $L_3$ may be between about 1 nm and about 10 um. In further embodiments, the third width $W_3$ may be between about 1 nm and about 10 um. In yet further embodiments, the area (e.g., $L_3$ times $W_3$) of the second conductive structure 116 is between about 1 $nm^2$ and about 100 $um^2$.

Figure 4:
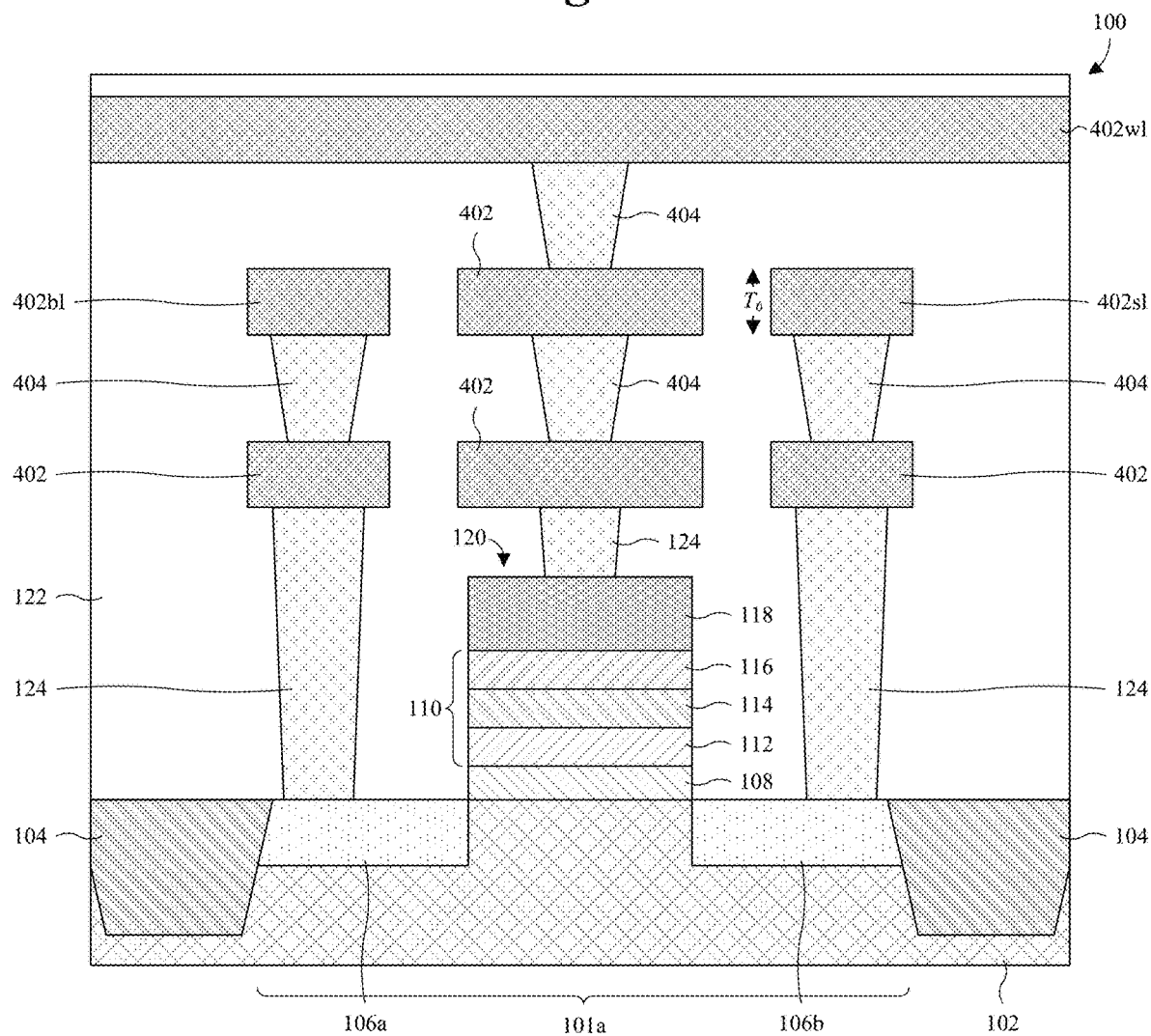
FIG. 4 illustrates a cross-sectional view of some more detailed embodiments of the first IC of FIG. 1.

FIG. 4 illustrates a cross-sectional view of some more detailed embodiments of the first IC 100 of FIG. 1.

As shown in FIG. 4, a plurality of conductive lines 402 (e.g., metal lines) and a plurality of conductive vias 404 (e.g., metal vias) are disposed in the ILD structure 122. The plurality of conductive lines 402, the plurality of conductive vias 404, and the plurality of conductive contacts 124 are electrically coupled together in a predefined manner and configured to provide electrical connections between various devices disposed throughout the first IC 100. In some embodiments, the plurality of conductive lines 402 and the plurality of conductive vias 404 may comprise, for example, copper (Cu), aluminum (Al), or the like. In further embodiments, the conductive contacts 124 may comprise, for example, tungsten (W), copper (Cu), aluminum (Al), or the like. The plurality of conductive lines 402 have a sixth thickness $T_6$. In further embodiments, a ratio between the sixth thickness $T_6$ and the first thickness $T_1$ (e.g., $T_6$ divided by $T_1$) is between about 200/1 and about 0.5/1. It will be appreciated that any number of conductive lines 402 and/or conductive vias 404 may be alternately stacked over one another in the ILD structure 122. In yet further embodiments, the plurality of conductive lines 402, the plurality of conductive vias 404, the plurality of conductive contacts 124, and the ILD structure 122 may be referred to as an interconnect structure.

A first one of the plurality of conductive lines 402 is denoted as 402w1 and may be referred to as a word line. In some embodiments, the word line may be electrically coupled to the polarization switching structure 110 via the interconnect structure and the gate electrode 118. A second one of the plurality of conductive lines 402 is denoted as 402b1 and may be referred to as a bit line. In further embodiments, the bit line may be electrically coupled to a first source/drain region 106a of the source/drain regions 106a-b via the interconnect structure. A third one of the plurality of conductive lines 402 is denoted as 402s1 and may be referred to as a source line. In yet further embodiments, the source line may be electrically coupled to a second source/drain region 106b of the source/drain regions 106a-b via the interconnect structure.

In some embodiments, the semiconductor substrate 102 may comprise any type of semiconductor body (e.g., monocrystalline silicon/CMOS bulk, silicon-germanium (SiGe), silicon on insulator (SOI), etc.). The isolation structure 104 may be, for example, a shallow trench isolation (STI) structure, a deep trench isolation (DTI) structure, or the like. In further embodiments, the source/drain regions 106a-b are doped regions of the semiconductor substrate 102 that have a doping type (e.g., n-type or p-type) opposite that of adjoining regions of the semiconductor substrate 102, or the adjoining regions of the semiconductor substrate 102 may be intrinsic. The ILD structure 122 may comprise one or more stacked ILD layers, which may respectively comprise a low-k dielectric (e.g., a dielectric material with a dielectric constant less than about 3.9), an oxide (e.g., $SiO_2$), or the like.

Figure 5:
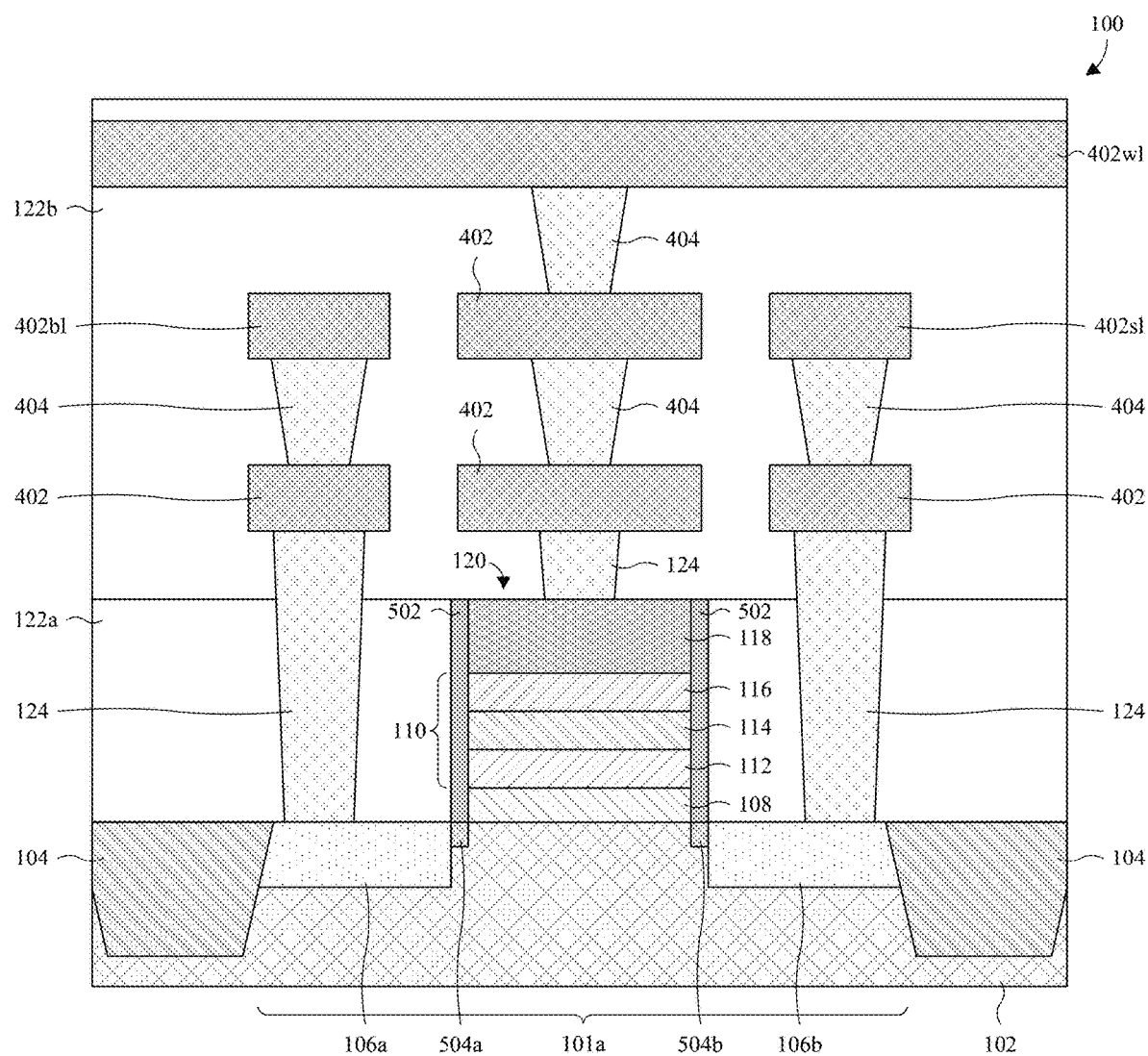
FIG. 5 illustrates a cross-sectional view of some other embodiments of the first IC of FIG. 4.

FIG. 5 illustrates a cross-sectional view of some other embodiments of the first IC 100 of FIG. 4.

As shown in FIG. 5, the ILD structure 122 comprise a first ILD structure 122a and a second ILD structure 122b. The second ILD structure 122b is disposed over the first ILD structure 122a and the device gate stack 120. In some embodiments, an upper surface of the first ILD structure 122a may be substantially co-planar with an upper surface of the gate electrode 118. In further embodiments, the first ILD structure 122a may comprise one or more stacked ILD layers. In yet further embodiments, the second ILD structure 122b may comprise one or more stacked ILD layers.

A pair of lightly-doped source/drain extensions (LDDs) 504a-b are disposed in the semiconductor substrate 102 and spaced apart. The LDDs 504a-b are doped regions of the semiconductor substrate 102 having a same doping type as the source/drain regions 106a-b. The LDDs 504a-b have a lower doping concentration than the source/drain regions 106a-b. A sidewall spacer 502 is disposed over the semiconductor substrate 102 and along sidewalls of the gate dielectric 108, the polarization switching structure 110, and the gate electrode 118. In further embodiments, the sidewall spacer 502 may comprise, for example, a nitride (e.g., silicon nitride (e.g., SiN)), an oxy-nitride (e.g., silicon oxy-nitride ($SiO_xN_y$)), or the like.

Figure 6:
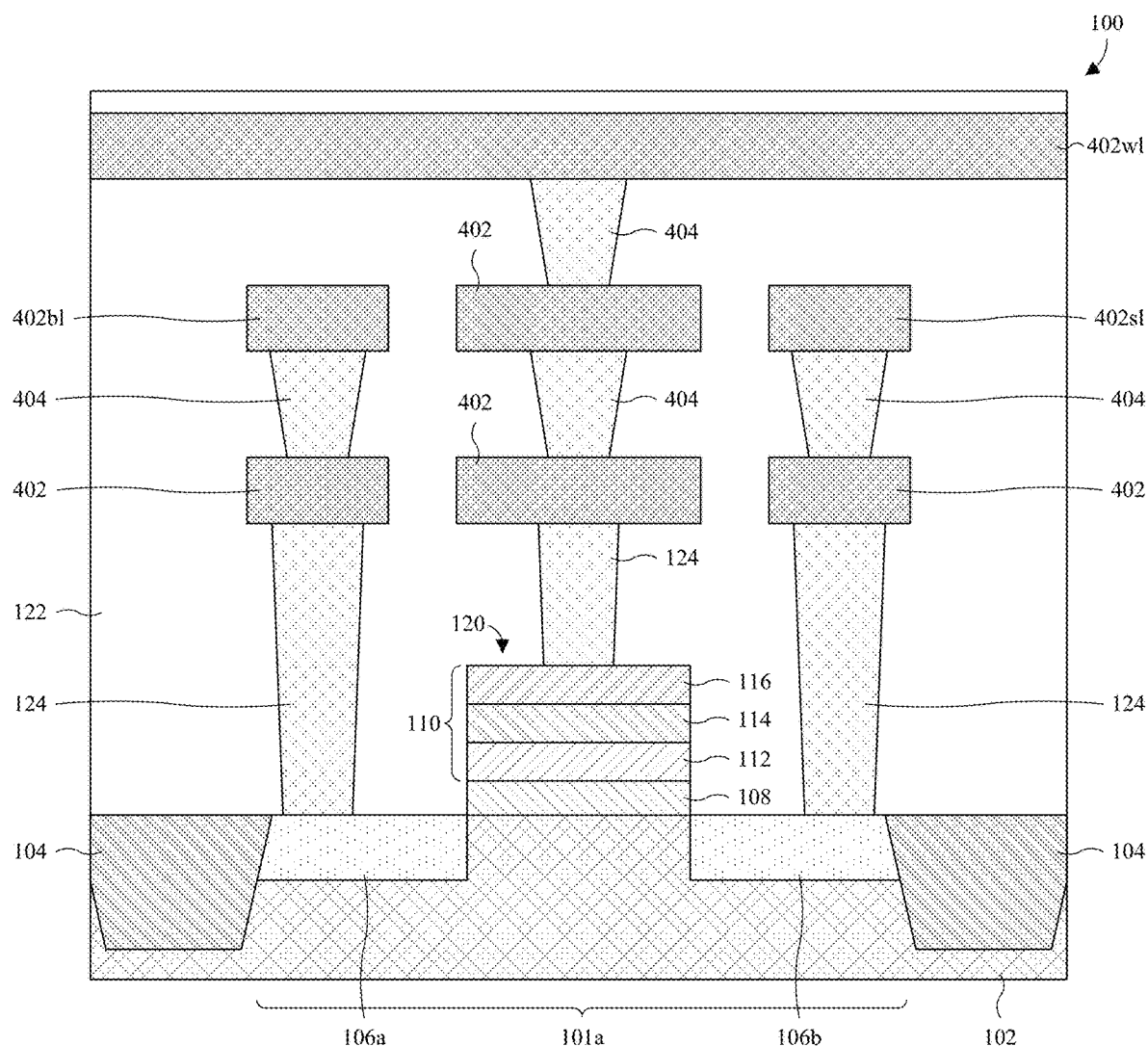
FIG. 6 illustrates a cross-sectional view of some other embodiments of the first IC of FIG. 4.

FIG. 6 illustrates a cross-sectional view of some other embodiments of the first IC 100 of FIG. 4.

As shown in FIG. 6, one of the plurality of conductive contacts 124 contacts the second conductive structure 116. In such embodiments, the device gate stack 120 may not comprise the gate electrode 118 (see, e.g., FIG. 5).

FIG. 7 illustrates a cross-sectional view of some embodiments of a second IC 700 comprising a second wakeup-free ferroelectric memory device 101b. In some embodiments, the second wakeup-free ferroelectric memory device 101b may be referred to as a back-end-of-line wakeup-free ferroelectric memory device. In further embodiments, the second wakeup-free ferroelectric memory device 101b may be part of a RAM device (e.g., FeRAM device). It will be appreciated that, in some embodiments, features of the second IC 700 that share a reference numeral with features of the first IC 100 may have substantially similar properties (e.g., dimensions, chemical compositions, relationships, etc.) as the features of the first IC 100 in which they share a reference numeral. It will further be appreciated that, in some embodiments, the second IC 700 may comprise a plurality of the second wakeup-free ferroelectric memory devices 101b disposed in an array.

As shown in FIG. 7, a semiconductor device 702 is disposed on the semiconductor substrate 102. In some embodiments, the semiconductor device 702 may be a metal-oxide semiconductor field-effect transistors (MOSFETs), bipolar junction transistors (BJTs), high-electron-mobility transistors (HEMTs), or any other front-end-of-line semiconductor device. In further embodiments, the semiconductor device 702 may comprise a gate dielectric 108, a gate electrode 118 disposed over the gate dielectric 108, and a pair of source/drain regions 106a-b.

A lower ILD structure 704 is disposed over the semiconductor substrate 102 and the semiconductor device 702. In some embodiments, a plurality of conductive contacts 124, a plurality of conductive lines 402, and a plurality of conductive vias 404 are disposed in the lower ILD structure 704. An upper ILD structure 708 is disposed over the lower ILD structure 704. In further embodiments, a plurality of conductive lines 402 and/or a plurality of conductive vias 404 are disposed in the upper ILD structure 708. A middle ILD structure 706 is disposed between the upper ILD structure 708 and the lower ILD structure 704. In yet further embodiments, the lower ILD structure 704, the middle ILD structure 706, and the upper ILD structure 708 may comprise one or more stacked ILD layers, which may respectively comprise a low-k dielectric (e.g., a dielectric material with a dielectric constant less than about 3.9), an oxide (e.g., $SiO_2$), or the like.

The second wakeup-free ferroelectric memory device 101b is disposed in the middle ILD structure 706. The second wakeup-free ferroelectric memory device 101b comprises a polarization switching structure 110. The polarization switching structure 110 comprises a ferroelectric structure 114 disposed between a first conductive structure 112 and a second conductive structure 116. In some embodiments, an upper surface of the second conductive structure 116 is substantially co-planar with an upper surface of the middle ILD structure 706. In further embodiments, a lower surface of the first conductive structure 112 is substantially co-planar with a lower surface of the middle ILD structure 706.

In some embodiments, the polarization switching structure 110 is electrically coupled to the second source/drain region 106b of the semiconductor device 702 via the plurality of conductive lines 402, the plurality of conductive vias 404, and the plurality of conductive contacts 124 disposed in the lower ILD structure 704. A fourth one of the plurality of conductive lines 402 is denoted as 402p1 and may be referred to as a plate line. In further embodiments, the plate line may be electrically coupled to the polarization switching structure 110 via the plurality of conductive lines 402 and/or conductive vias 404 disposed in the upper ILD structure 708. In yet further embodiments, one of the plurality of conductive vias 404 (or conductive lines 402) disposed in the lower ILD structure 704 may contact the first conductive structure 112, and one of the plurality of conductive vias 404 (or conductive lines 402) disposed in the upper ILD structure 708 may contact the second conductive structure 116.

The first conductive structure 112 has an overall electronegativity that is greater than or equal to an overall electronegativity of the ferroelectric structure 114. The second conductive structure 116 has an overall electronegativity that is greater than or equal the overall electronegativity of the ferroelectric structure 114. More specifically, both the overall electronegativity of the first conductive structure 112 and the overall electronegativity of the second conductive structure 116 are greater than or equal to the overall electronegativity of the ferroelectric structure 114.

Because the overall electronegativity of the first conductive structure 112 and the overall electronegativity of the second conductive structure 116 are greater than or equal to the overall electronegativity of the ferroelectric structure 114, a memory window of the second wakeup-free ferroelectric memory device 101b may not degrade to an unsatisfactory condition after power has been removed from the polarization switching structure 110. In other words, the second wakeup-free ferroelectric memory device 101b does not require a wakeup procedure to improve the memory window of the second wakeup-free ferroelectric memory device 101b to function properly (e.g., read, write, erase). Accordingly, compared to non-wakeup-free ferroelectric memory, the second wakeup-free ferroelectric memory device 101b may consume less power and/or the second IC 700 may comprise a greater number (or have a greater density) of the second wakeup-free ferroelectric memory devices 101b.

FIG. 8 illustrates a cross-sectional view of some other embodiments of the second IC 700 of FIG. 7.

As shown in FIG. 8, some of the plurality of conductive lines 402, the plurality of conductive vias 404, and the plurality of conductive contacts 124 disposed in the lower ILD structure 704 electrically couple the second wakeup-free ferroelectric memory device 101b to the gate electrode 118 of the semiconductor device 702.

Figure 9:
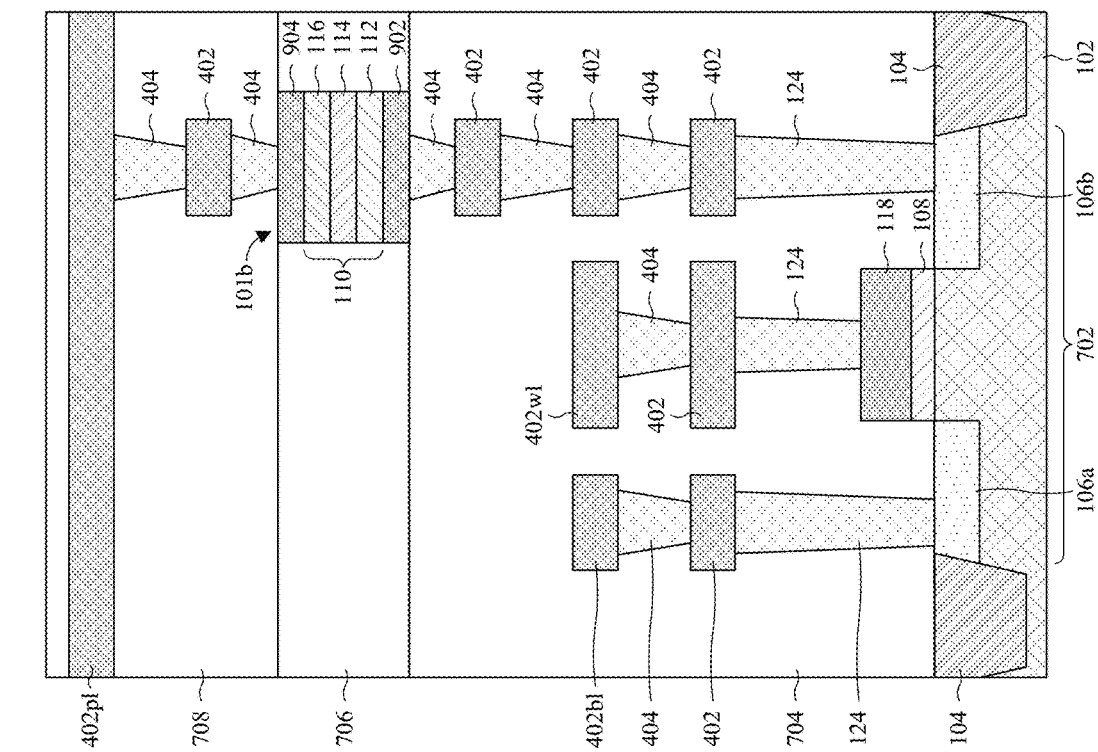
FIG. 9 illustrates a cross-sectional view of some other embodiments of the second IC of FIG. 7.

FIG. 9 illustrates a cross-sectional view of some other embodiments of the second IC 700 of FIG. 7.

As shown in FIG. 9, a first electrode 902 and a second electrode 904 are disposed on opposite sides of the polarization switching structure 110. In some embodiments, the first electrode 902 and/or the second electrode 904 are disposed in the middle ILD structure 706. In other embodiments, the first electrode 902 is disposed in the lower ILD structure 704 and/or the second electrode 904 is disposed in the upper ILD structure 708.

The first electrode 902 contacts the first conductive structure 112 and is disposed between the first conductive structure 112 and the semiconductor substrate 102. The second electrode 904 contacts the second conductive structure 116, and the polarization switching structure 110 is disposed between the second electrode 904 and the semiconductor substrate 102. In some embodiments, one of the plurality of conductive vias 404 (or conductive lines 402) disposed in the lower ILD structure 704 may contact the first electrode 902, and one of the plurality of conductive vias 404 (or conductive lines 402) disposed in the upper ILD structure 708 may contact the second electrode 904. In further embodiments, the first electrode 902 may comprise, for example, Al, Ti, Ta, Au, Pt, W, Ni, Jr, TiN, TaN, some other conductive material, or a combination of the foregoing. In yet further embodiments, the second electrode 904 may comprise, for example, Al, Ti, Ta, Au, Pt, W, Ni, Jr, TiN, TaN, some other conductive material, or a combination of the foregoing.

In some embodiments, the first electrode 902 and the second electrode 904 may have a same chemical composition. In other embodiments, the chemical composition of the first electrode 902 may be different than the chemical composition of the second electrode 904. The overall electronegativity of the first conductive structure 112 may be greater than or equal to the overall electronegativity of the first electrode 902. In yet further embodiments, the overall electronegativity of the second conductive structure 116 may be greater than or equal to the overall electronegativity of the second electrode 904.

In some embodiments, sidewalls of first electrode 902, sidewalls of the first conductive structure 112, sidewalls of the ferroelectric structure 114, sidewalls of the second conductive structure 116, and sidewalls of the second electrode 904 may be substantially aligned in a vertical direction. In such embodiments, an area (e.g. length (across the page of FIG. 2) times width (into/out of the page of FIG. 2)) of the first electrode 902, an area of the first conductive structure 112, an area of the ferroelectric structure 114, an area of the second conductive structure 116, and an area of the second electrode 904 may be substantially the same. In other embodiments, the sidewalls of the first conductive structure 112 may be disposed between the sidewalls of the first electrode 902, the sidewalls of the ferroelectric structure 114 may be disposed between the sidewalls of the first conductive structure 112, the sidewalls of the second conductive structure 116 may be disposed between the sidewalls of the ferroelectric structure 114, and/or the sidewalls of the second electrode 904 may be disposed between the sidewalls of the second conductive structure 116. In such embodiments, the area of the first conductive structure 112 may be less than the area of the first electrode 902, the area of the ferroelectric structure may be less than the area of the first conductive structure 112, the area of the second conductive structure 116 may be less than the area of the ferroelectric structure 114, and/or the area of the second electrode 904 may be less than the area of the second conductive structure 116.

Figure 10:
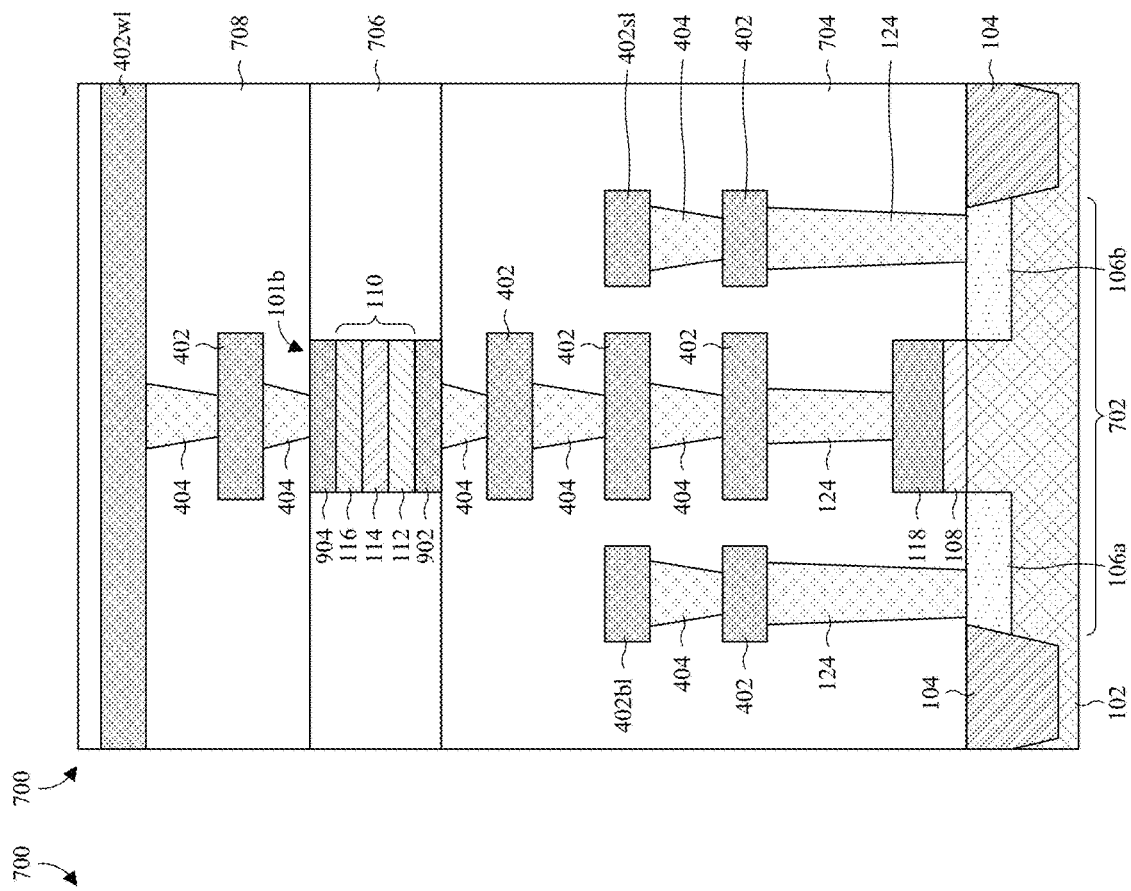
FIG. 10 illustrates a cross-sectional view of some other embodiments of the second IC of FIG. 9.

FIG. 10 illustrates a cross-sectional view of some other embodiments of the second IC 700 of FIG. 9.

As shown in FIG. 10, some of the plurality of conductive lines 402, the plurality of conductive vias 404, and the plurality of conductive contacts 124 disposed in the lower ILD structure 704 electrically couple the second wakeup-free ferroelectric memory device 101b to the gate electrode 118 of the semiconductor device 702.

FIGS. 11-20 illustrate a series of cross-sectional views of some embodiments for forming the first IC 100 of FIG. 5.

Figure 11:
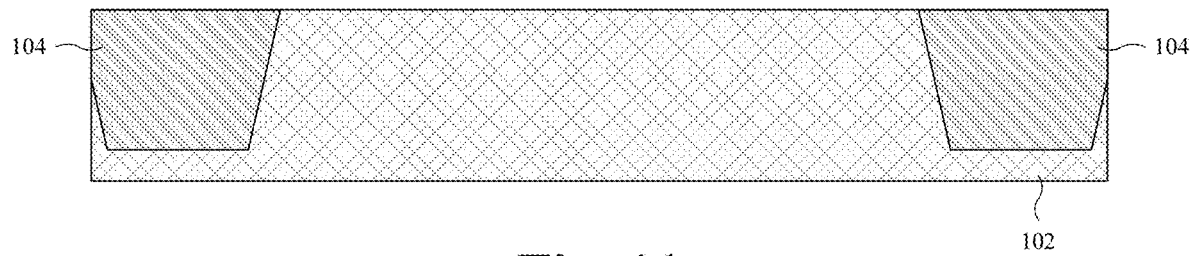
FIGS. 11-20 illustrate a series of cross-sectional views of some embodiments for forming the first IC of FIG. 5.

As shown in FIG. 11, an isolation structure 104 is formed within a semiconductor substrate 102. In some embodiments, the isolation structure 104 may be formed by selectively etching the semiconductor substrate 102 to form a trench in the semiconductor substrate 102, and subsequently filing the trench with a dielectric material. In further embodiments, the semiconductor substrate 102 is selectively etched by forming a masking layer (not shown) over the semiconductor substrate 102, and subsequently exposing the semiconductor substrate 102 to an etchant configured to selectively remove unmasked portions of the semiconductor substrate 102. In yet further embodiments, the dielectric material may comprise an oxide (e.g., $SiO_2$), a nitride, a carbide, or the like.

Figure 12:
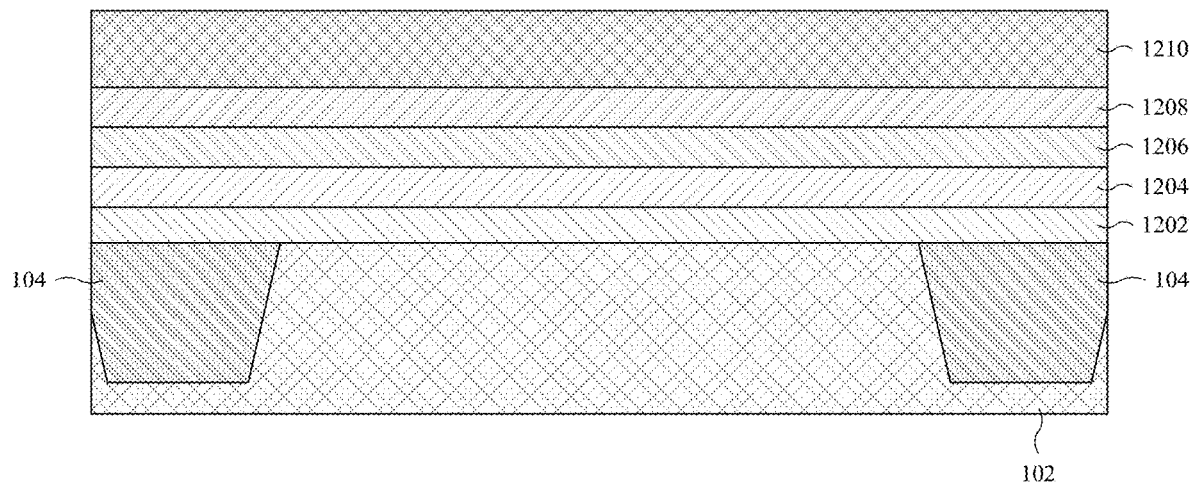

As shown in FIG. 12, a dielectric layer 1202, a first conductive layer 1204, a ferroelectric layer 1206, a second conductive layer 1208, and a processing layer 1210 are formed over the isolation structure 104 and the semiconductor substrate 102. In some embodiments, the dielectric layer 1202 is formed on the semiconductor substrate 102 and the isolation structure 104. The first conductive layer 1204 may be formed on the dielectric layer 1202. The ferroelectric layer 1206 is formed on the first conductive layer 1204. The second conductive layer 1208 is formed on the ferroelectric layer 1206. The processing layer 1210 may be formed on the second conductive layer 1208.

In some embodiments, a process for forming the dielectric layer 1202 comprises depositing or growing the dielectric layer 1202 on the semiconductor substrate 102. In further embodiments, the dielectric layer 1202 may comprise, for example, an oxide (e.g., $SiO_2$), a high-k dielectric material (e.g., HfO2, ZrO2, or some other dielectric material with a dielectric constant greater than about 3.9), some other dielectric material, or a combination of the foregoing. In yet further embodiments, the dielectric layer 1202 may be deposited or grown by thermal oxidation, chemical vapor deposition (CVD), physical vapor deposition (PVD), atomic layer deposition (ALD), sputtering, or some other deposition or growth process.

In some embodiments, a process for forming the first conductive layer 1204 comprises depositing or growing the first conductive layer 1204 on the dielectric layer 1202. In further embodiments, the first conductive layer 1204 may comprise, for example, a metal (e.g., Al, Ti, Ta, Au, Pt, W, Ni, Jr, etc.), a metal-nitride (e.g., TiN, TaN, etc.), a metal-oxide (e.g., $IrO_2$), doped polysilicon (e.g., n-type/p-type polysilicon), or the like. In yet further embodiments, the first conductive layer 1204 may be deposited or grown by CVD, PVD, ALD, epitaxy, sol-gel, sputtering, electrochemical plating, electroless plating, or some other deposition or growth process.

In some embodiments, a process for forming the ferroelectric layer 1206 comprises depositing or growing the ferroelectric layer 1206 on the first conductive layer 1204. In further embodiments, the ferroelectric layer 1206 may comprise, for example, a metal-oxide (e.g., $Hf_xO_y$), a component-metal-oxide (e.g., $Hf_xSi_yO_z$, $Hf_xAl_yO_z$, $Hf_xGd_yO_z$, $Hf_xZr_yO_z$, $Hf_xLa_yO_z$, $Hf_xSr_yO_z$, $Hf_xY_yO_z$, STO, etc.), a metal-oxynitride (e.g., $Hf_xO_yN_z$), or the like. In yet further embodiments, the ferroelectric layer 1206 may be deposited or grown by CVD, PVD, ALD, epitaxy, sol-gel, sputtering, electrochemical plating, electroless plating, or some other deposition or growth process.

In some embodiments, a process for forming the second conductive layer 1208 comprises depositing or growing the second conductive layer 1208 on the ferroelectric layer 1206. In further embodiments, the second conductive layer 1208 may comprise, for example, a metal (e.g., Al, Ti, Ta, Au, Pt, W, Ni, Jr, etc.), a metal-nitride (e.g., TiN, TaN, etc.), a metal-oxide (e.g., $IrO_2$), doped polysilicon (e.g., n-type/p-type polysilicon), or the like. In yet further embodiments, the second conductive layer 1208 may be deposited or grown by CVD, PVD, ALD, epitaxy, sol-gel, sputtering, electrochemical plating, electroless plating, or some other deposition or growth process.

In some embodiments, a process for forming the processing layer 1210 comprises depositing or growing the processing layer 1210 on the second conductive layer 1208. In further embodiments, the processing layer 1210 may comprise, for example, polysilicon (doped or undoped), an oxide (e.g., $SiO_2$), or some other material that may be selectively etched in relation to the second conductive layer 1208. In yet further embodiments, the processing layer 1210 may be deposited or grown by CVD, PVD, ALD, epitaxy, sputtering, or some other deposition or growth process.

The first conductive layer 1204 has an overall electronegativity that is greater than or equal to an overall electronegativity of the ferroelectric layer 1206. The second conductive layer 1208 has an overall electronegativity that is greater than or equal to the overall electronegativity of the ferroelectric layer 1206. More specifically, both the overall electronegativity of the first conductive layer 1204 and the overall electronegativity of the second conductive layer 1208 are greater than or equal to the overall electronegativity of the ferroelectric layer 1206.

In some embodiments, the overall electronegativity of the first conductive layer 1204 is greater than or equal to an overall electronegativity of the dielectric layer 1202. The overall electronegativity of the dielectric layer 1202 may be less than the overall electronegativity of the ferroelectric structure 114. The first conductive layer 1204 and the second conductive layer 1208 may have a same chemical composition. In other embodiments, the chemical composition of the first conductive layer 1204 may be different than the chemical composition of the second conductive layer 1208.

In some embodiments, the first conductive layer 1204 is formed as a conformal layer having a thickness between about 0.1 nm and about 1,000 nm. The ferroelectric layer 1206 may be formed as a conformal layer having a thickness between about 1 nm and about 100 nm. In further embodiments, the second conductive layer 1208 is formed as a conformal layer having a thickness between about 0.1 nm and about 1,000 nm. A combined thickness of the first conductive layer 1204, the ferroelectric layer 1206, and the second conductive layer 1208 may be between about 1.2 nm and about 2,100 nm. In yet further embodiments, the dielectric layer 1202 is formed as a conformal layer having a thickness that is between about 1/100 and about 1/1 the combined thickness of the first conductive layer 1204, the ferroelectric layer 1206, and the second conductive layer 1208.

Figure 13:
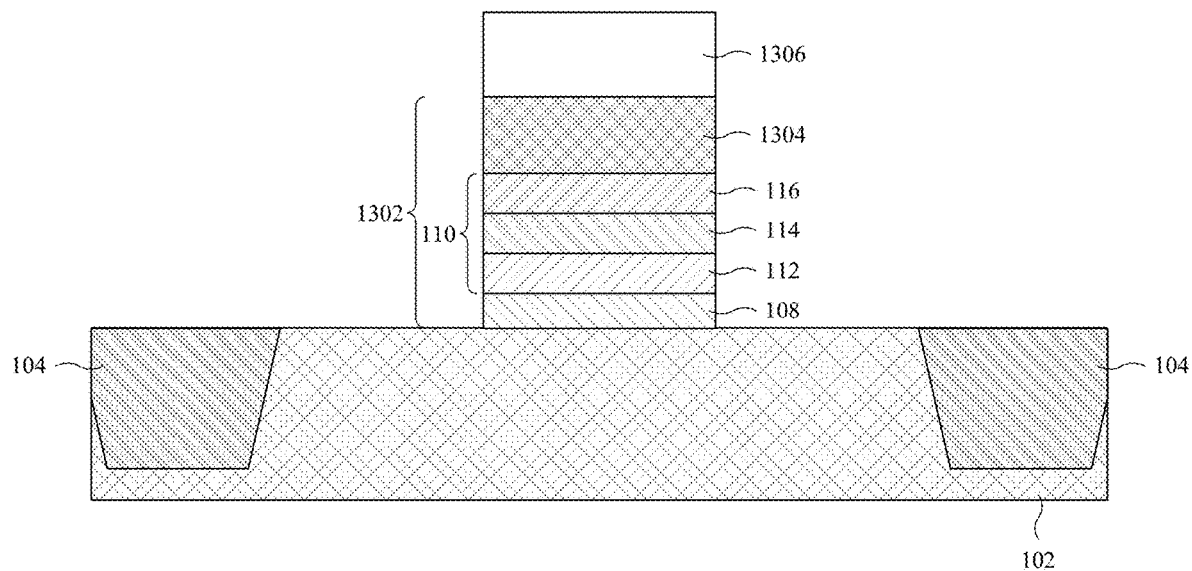

As shown in FIG. 13, the dielectric layer 1202, the first conductive layer 1204, the ferroelectric layer 1206, the second conductive layer 1208, and the processing layer 1210 (see, e.g., FIG. 12) are patterned into an initial gate stack 1302. The initial gate stack 1302 comprises a polarization switching structure 110 disposed between a gate dielectric 108 and a sacrificial gate 1304. The polarization switching structure 110 comprises a ferroelectric structure 114 disposed between a first conductive structure 112 and a second conductive structure 116.

In some embodiments, a process for forming the initial gate stack 1302 comprises forming a patterned masking layer 1306 (e.g., positive/negative photoresist) over/on the processing layer 1210. The patterned masking layer 1306 may be formed by a spin-on process and patterned using photolithography. Thereafter, an etch (e.g., wet/dry etch) is performed into the processing layer 1210, the second conductive layer 1208, the ferroelectric layer 1206, the first conductive layer 1204, and the dielectric layer 1202 with the patterned masking layer 1306 in place. The etch removes unmasked portions of the processing layer 1210, the second conductive layer 1208, the ferroelectric layer 1206, the first conductive layer 1204, and the dielectric layer 1202, thereby forming the sacrificial gate 1304, the second conductive structure 116, the ferroelectric structure 114, the first conductive structure 112, and the gate dielectric 108, respectively. Subsequently, the patterned masking layer 1306 may be stripped away.

In some embodiments, the initial gate stack 1302 may be formed by a single patterning process. In other embodiments, the initial gate stack 1302 may be formed by multiple patterning processes, each of which pattern one (or a combination) of the processing layer 1210, the second conductive layer 1208, the ferroelectric layer 1206, the first conductive layer 1204, and the dielectric layer 1202. It will be appreciated that, in some embodiments, one (or a combination) of the first conductive layer 1204, the ferroelectric layer 1206, the second conductive layer 1208, and the processing layer 1210 may be patterned prior to a layer being subsequently formed thereon. For example, the dielectric layer 1202 may be deposited and then patterned into the gate dielectric 108 before the first conductive layer 1204 is formed on the gate dielectric 108.

Figure 14:
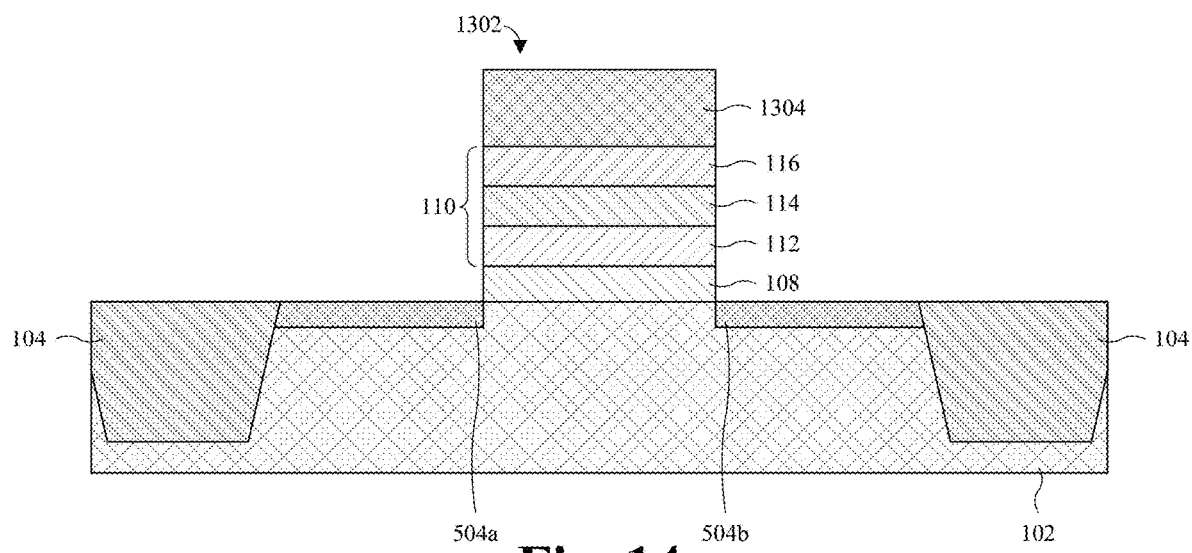

As shown in FIG. 14, a pair of lightly-doped source/drain extensions (LDDs) 504a-b are formed in the semiconductor substrate 102. The LDDs 504a-b are formed on opposite sides of the initial gate stack 1302. In some embodiments, the LDDs 504a-b are formed by an ion implantation process and may utilize a masking layer (not shown) to selectively implant ions in the semiconductor substrate 102. In further embodiments, the initial gate stack 1302 may be utilized as the masking layer to form the LDDs 504a-b.

Figure 15:
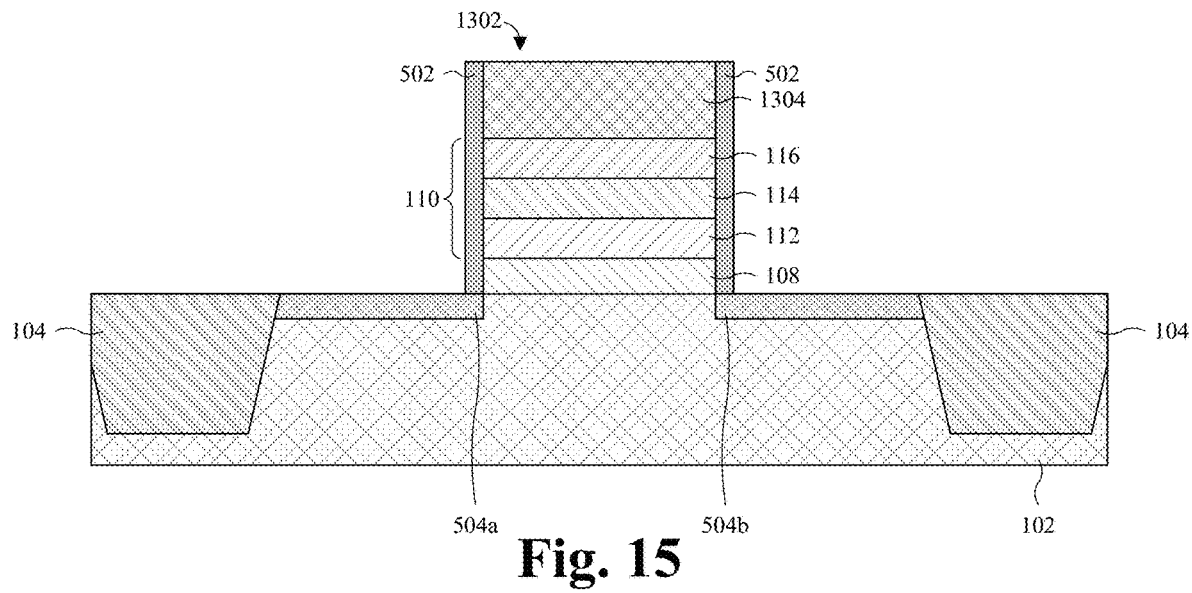

As shown in FIG. 15, a sidewall spacer 502 is formed over the semiconductor substrate 102 and along sides of the initial gate stack 1302. In some embodiments, the sidewall spacer 502 may be formed by depositing a spacer layer (not shown) over the semiconductor substrate 102 and the initial gate stack 1302. In further embodiments, the spacer layer may comprise a nitride (e.g., SiN), an oxy-nitride (e.g., $SiO_xN_y$), or the like. The spacer layer may be deposited by PVD, CVD, ALD, sputtering, or some other deposition process. Subsequently, the spacer layer is etched to remove the spacer layer from horizontal surfaces, leaving the spacer layer along sides of the initial gate stack 1302 as the sidewall spacer 502. In yet further embodiments, the sidewall spacer 502 may be formed prior to forming the LDDs 504a-b. In such embodiments, the LDDs 504a-b may be formed using an angled ion implantation process.

Figure 16:
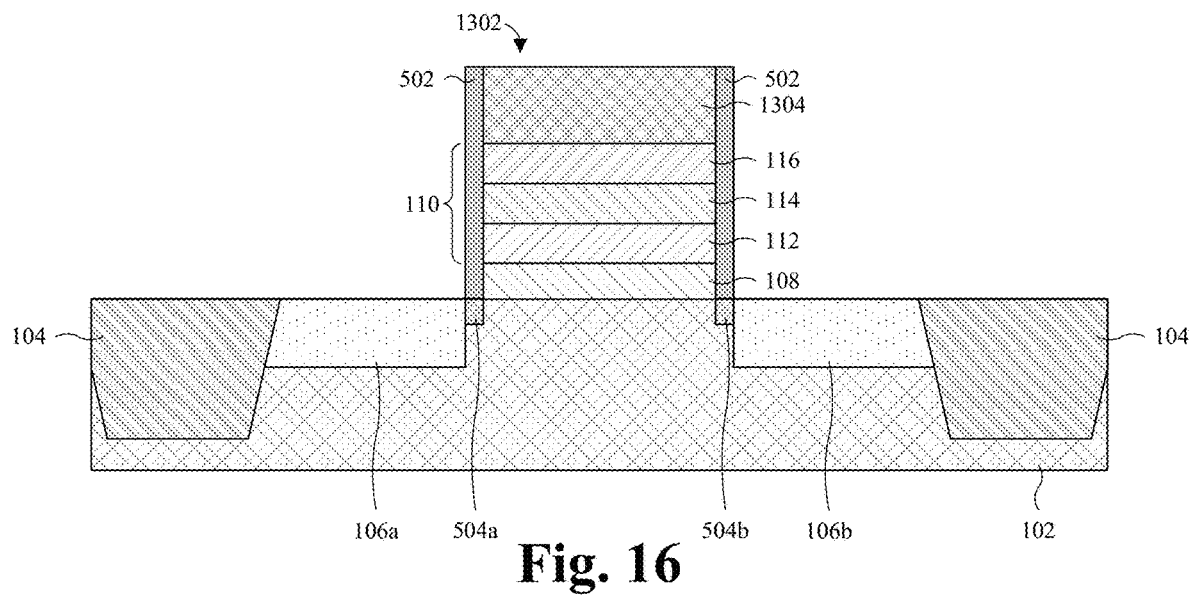

As illustrated by FIG. 16, a pair of source/drain regions 106a-b are formed in the semiconductor substrate 102. The source/drain regions 106a-b are formed on opposite sides of the sidewall spacer 502. In some embodiments, the source/drain regions 106a-b are formed by an ion implantation process and may utilize a masking layer (not shown) to selectively implant ions into the semiconductor substrate 102. In further embodiments, the initial gate stack 1302 and the sidewall spacer 502 may be utilized as the masking layer to form the source/drain regions 106a-b.

Figure 17:
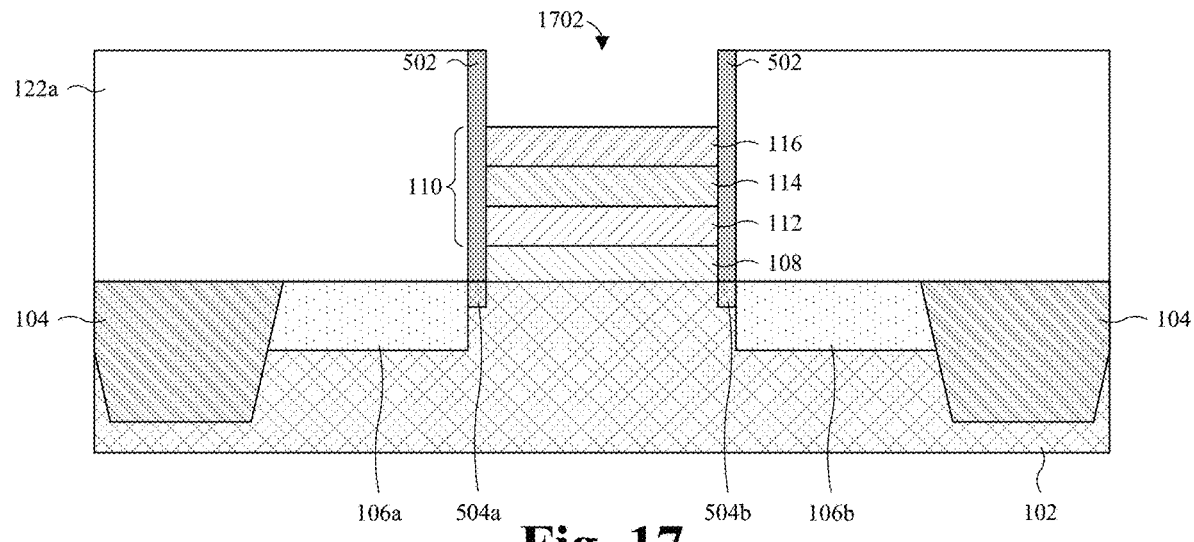

As shown in FIG. 17, a first interlayer dielectric (ILD) structure 122a is formed over the semiconductor substrate 102 and the isolation structure 104. The first ILD structure 122a may be formed with a substantially planar upper surface that is co-planar with an upper surface of the sidewall spacer 502. In some embodiments, a process for forming the first ILD structure 122a comprises depositing an ILD layer on the semiconductor substrate 102, the isolation structure 104, the sidewall spacer 502, and the sacrificial gate 1304 (see, e.g., FIG. 16). The ILD layer may be deposited by CVD, PVD, sputtering, or some other deposition process. Thereafter, a planarization process (e.g., a chemical-mechanical planarization (CMP)) may be performed on the ILD layer to form the first ILD structure 122a.

Also shown in FIG. 17, the sacrificial gate 1304 (see, e.g., FIG. 16) is removed, thereby forming an opening 1702 that is defined by inner sidewalls of the sidewall spacer 502 and an upper surface of the second conductive structure 116. In some embodiments, a process for removing the sacrificial gate 1304 comprises performing an etch (e.g., dry or wet etch) to selectively remove the sacrificial gate 1304. In further embodiments, before the etch, a masking layer (not shown) may be formed covering the first ILD structure 122a and the sidewall spacer 502, while leaving the sacrificial gate 1304 exposed. Thereafter, the etch is performed with the masking layer in place, thereby selectively removing the sacrificial gate 1304. Subsequently, the masking layer may be stripped away.

Figure 18:
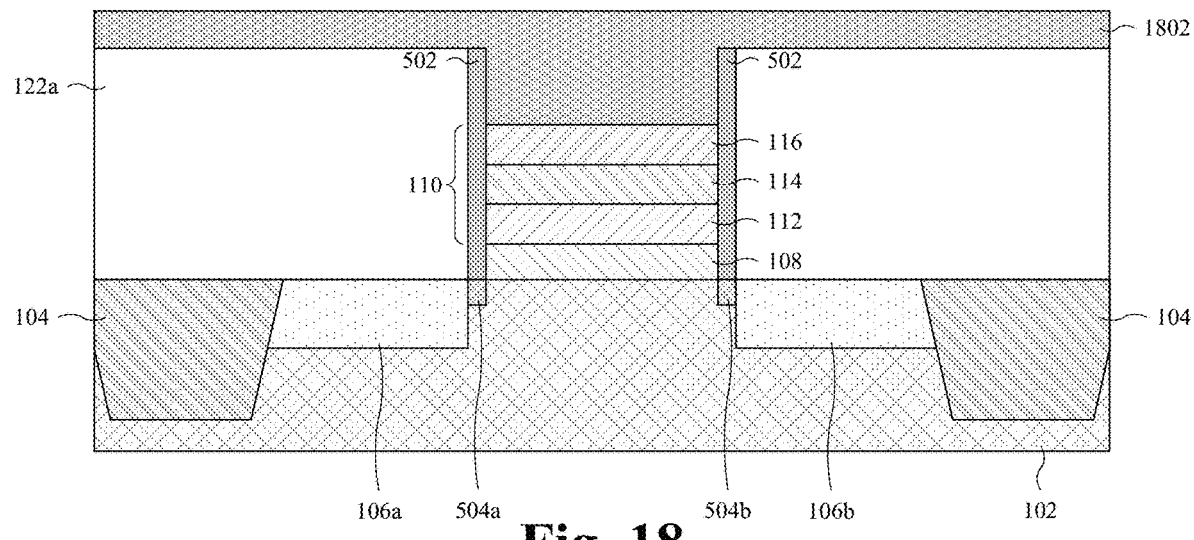

As shown in FIG. 18, a gate electrode layer 1802 is formed filling the opening 1702 and over the second conductive structure 116, the sidewall spacer 502, and the first ILD structure 122a. The gate electrode layer 1802 is conductive and may comprise, for example, a metal W, Al, Ti, Mo, or the like. In some embodiments, the gate electrode layer 1802 may be formed by CVD, PVD, ALD, sputtering, electrochemical plating, electroless plating, or some other deposition process.

In some embodiments, before the gate electrode layer 1802 is formed, a capping layer (not shown) may be formed lining the opening 1702 and over the second conductive structure 116, the sidewall spacer 502, and the first ILD structure 122a. In such embodiments, the gate electrode layer 1802 may be formed on the capping layer. The capping layer may comprise, for example, TiN, TaN, or the like. In further embodiments, the capping layer may be formed by CVD, PVD, ALD, sputtering, or some other deposition process. In yet further embodiments, the gate electrode layer 1802 and/or the capping layer has an overall electronegativity that is less than the overall electronegativity of the ferroelectric structure 114.

Figure 19:
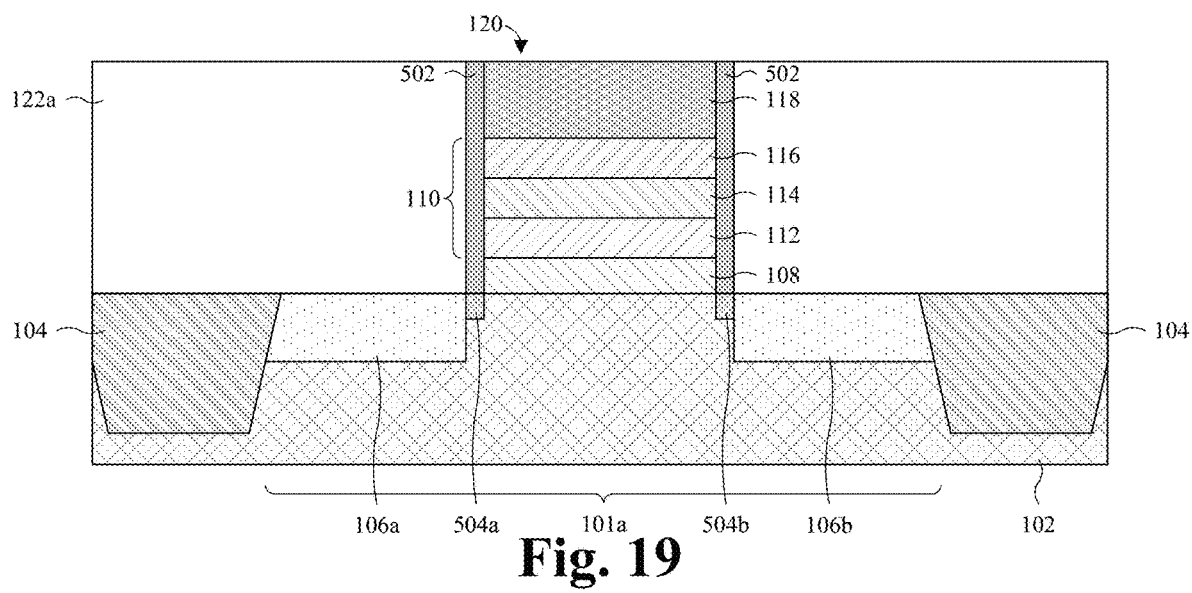

As shown in FIG. 19, a gate electrode 118 is formed on the second conductive structure 116 and between the inner sidewalls of the sidewall spacer 502. In some embodiments, a process for forming the gate electrode 118 comprises performing a planarization process (e.g., CMP) into the gate electrode layer 1802 (see, e.g., FIG. 18). The planarization process removes an upper portion of the gate electrode layer 1802, thereby forming the gate electrode 118. In further embodiments, after the gate electrode 118 is formed, formation of a device gate stack 120 is complete, which may also complete formation of a first wakeup-free ferroelectric memory device 101a. In yet further embodiments, the process of forming the device gate stack 120 as described above may be referred to as a gate-last high-k/metal gate (HKMG) process.

It will be appreciated that, in some embodiments, the device gate stack 120 may be formed by other processes. For example, the device gate stack 120 may be formed by a gate-first HKMG process (e.g., the metal gate electrode is formed prior to source/drain formation), a fully silicided (FUSI) metal gate process (e.g., fully siliciding a polysilicon gate), or a doped polysilicon gate process (e.g., self-aligned polysilicon gate process). Depending on the process in which the device gate stack 120 is formed, the processing layer may comprise, for example, doped polysilicon (e.g., n-type/p-type polysilicon), undoped polysilicon, a metal (e.g., W, Al, Ti, Mo, or the like), a metal-nitride (e.g., TiN, TaN, or the like), some other conductive material, or a combination of the foregoing.

Figure 20:
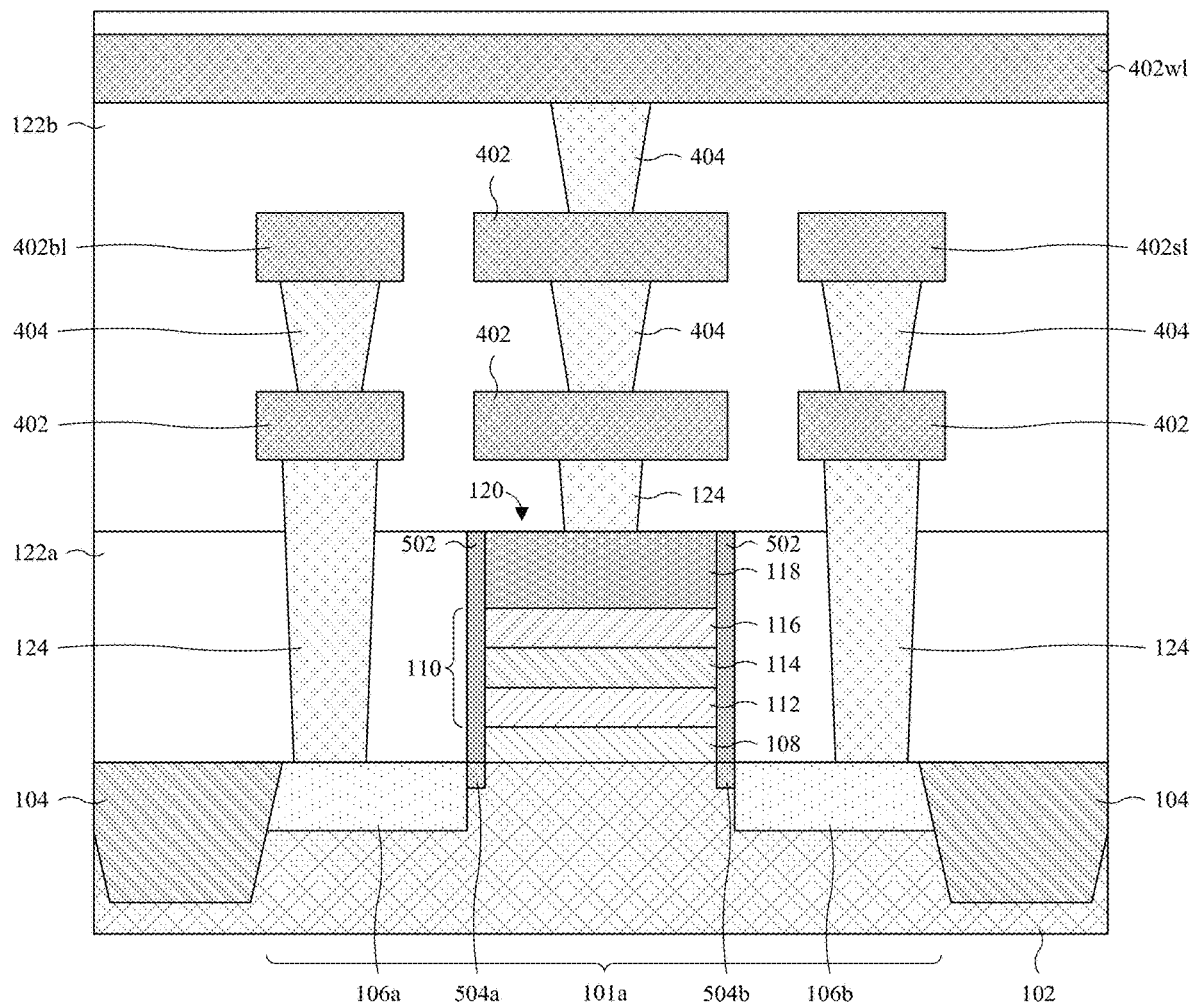

As shown in FIG. 20, a second ILD structure 122b, a plurality of conductive contacts 124, a plurality of conductive lines 402, and a plurality of conductive vias 404 are formed over the first ILD structure 122a and the first wakeup-free ferroelectric memory device 101a. The second ILD structure 122b may be formed with a substantially planar upper surface. In some embodiments, a process for forming the second ILD structure 122b comprises depositing a plurality of ILD layers, which are stacked on one another, over the first ILD structure 122a and the first wakeup-free ferroelectric memory device 101a. The ILD layers may be deposited by CVD, PVD, sputtering, or some other deposition process. In further embodiments, a planarization process (e.g., CMP) may be performed on one or more of the plurality of ILD layers.

In some embodiments, a process for forming the plurality of conductive contacts 124 comprises forming a first ILD layer on the first ILD structure 122a, the sidewall spacer 502, and the gate electrode 118. Thereafter, the first ILD layer and the first ILD structure 122a are selectively etched to form contact openings (not shown) that correspond to the plurality of conductive contacts 124. A conductive material (e.g., W) is then deposited on the first ILD layer and filling the contacts opening. Subsequently, a planarization process (e.g., CMP) is performed into the conductive material and the first ILD layer, thereby forming the plurality of conductive contacts 124 extending through the first ILD structure 122a. In further embodiments, the conductive material may be deposited by CVD, PVD, ALD, sputtering, electrochemical plating, electroless plating, or some other deposition process.

In some embodiments, a process for forming the plurality of conductive lines 402 and the plurality of conductive vias 404 comprises forming a second ILD layer over the plurality of conductive contacts 124 and the first ILD layer. The second ILD layer is selectively etched to form a first set of conductive line openings (not shown) that correspond to a first set of conductive lines of the plurality of conductive lines 402. A conductive material (e.g., Cu) is deposited on the second ILD layer and filling the first set of conductive line openings. A planarization process (e.g., CMP) is performed into the conductive material and the second ILD layer, thereby forming the first set of conductive lines.

Thereafter, a third ILD layer is formed over the first set of conductive lines and the second ILD layer. The third ILD layer is selectively etched to form a first set of conductive via openings (not shown) that correspond to a first set of conductive vias of the plurality of conductive vias 404. A conductive material (e.g., Cu) is deposited on the third ILD layer and filling the first set of conductive via openings. A planarization process (e.g., CMP) is performed into the conductive material and the third ILD layer, thereby forming the first set of conductive vias. This process (e.g., alternating formation of conductive lines and vias) is repeated until the plurality of conductive lines 402 and the plurality of conductive vias 404 are formed.

While FIGS. 11-20 illustrate some embodiments for forming the first IC 100 of FIG. 5, it will be appreciated that, in some embodiments, the second IC 700 of FIG. 10 may be formed by substantially similar processes. For example, the first electrode 902 and the second electrode 904 may be formed by a process(es) substantially similar to the process (es) described above regarding formation of the plurality of conductive contacts 124, the plurality of conductive lines 402, and/or the plurality of conductive vias 404 (see, e.g., FIG. 20). Further, the second conductive structure 116, the ferroelectric structure 114, and the first conductive structure 112 of the second IC 700 may be formed by a process(es) substantially similar to the process(es) described above regarding formation of the second conductive structure 116, the ferroelectric structure 114, and/or the first conductive structure 112 (see, e.g., FIGS. 12-13). Moreover, the lower ILD structure 704, the middle ILD structure 706, and/or the upper ILD structure 708 may be formed by a process(es) substantially similar to the process(es) described above regarding formation of the first ILD structure 122a and/or the second ILD structure 122b (see, e.g., FIG. 17 and FIG. 20).

Figure 21:
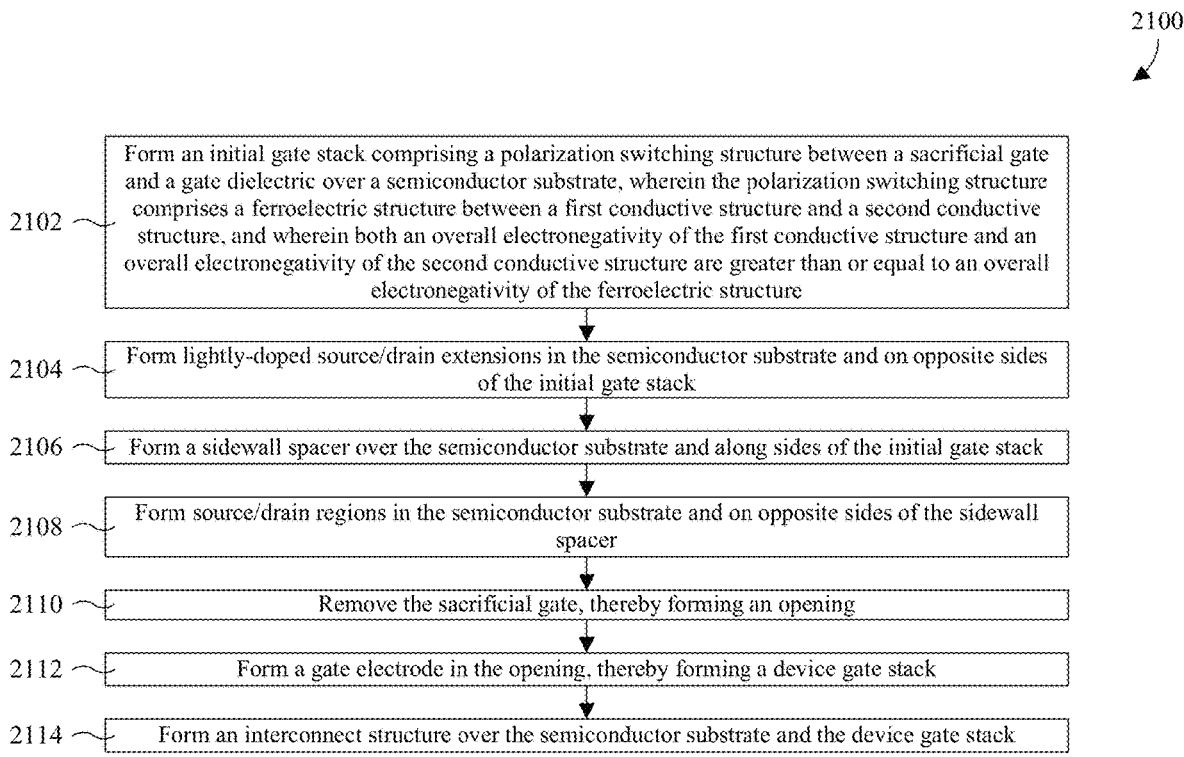
FIG. 21 illustrates a flowchart of some embodiments of a method for forming an IC comprising a front-end-of-line wakeup-free ferroelectric memory device.

FIG. 21 illustrates a flowchart 2100 of some embodiments of a method for forming an integrated chip (IC) comprising a front-end-of-line wakeup-free ferroelectric memory device. The front-end-of-line wakeup-free ferroelectric memory device may be the first wakeup-free ferroelectric memory device 101a. While the flowchart 2100 of FIG. 21 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2102, an initial gate stack comprising a polarization switching between a sacrificial gate and a gate dielectric is formed over a semiconductor substrate. The polarization switching structure comprises a ferroelectric structure between a first conductive structure and a second conductive structure, where both an overall electronegativity of the first conductive structure and an overall electronegativity of the second conductive structure are greater than or equal to an overall electronegativity of the ferroelectric structure. FIGS. 11-13 illustrate a series of cross-sectional views of some embodiments corresponding to act 2102.

At act 2104, lightly-doped source/drain extensions are formed in the semiconductor substrate and on opposite sides of the initial gate stack. FIG. 14 illustrates a cross-sectional view of some embodiments corresponding to act 2104.

At act 2106, a sidewall spacer is formed over the semiconductor substrate and along sides of the initial gate stack. FIG. 15 illustrates a cross-sectional view of some embodiments corresponding to act 2106.

At act 2108, source/drain regions are formed in the semiconductor substrate and on opposite sides of the sidewall spacer. FIG. 16 illustrates a cross-sectional view of some embodiments corresponding to act 2108.

At act 2110, the sacrificial gate is removed, thereby forming an opening. FIG. 17 illustrates a cross-sectional view of some embodiments corresponding to act 2110.

At act 2112, a gate electrode is formed in the opening, thereby forming a device gate stack. FIGS. 18-19 illustrate a series of cross-sectional views of some embodiments corresponding to act 2112.

At act 2114, an interconnect structure is formed over the semiconductor substrate and the device gate stack. FIG. 20 illustrates a cross-sectional view of some embodiments corresponding to act 2114.

Figure 22:
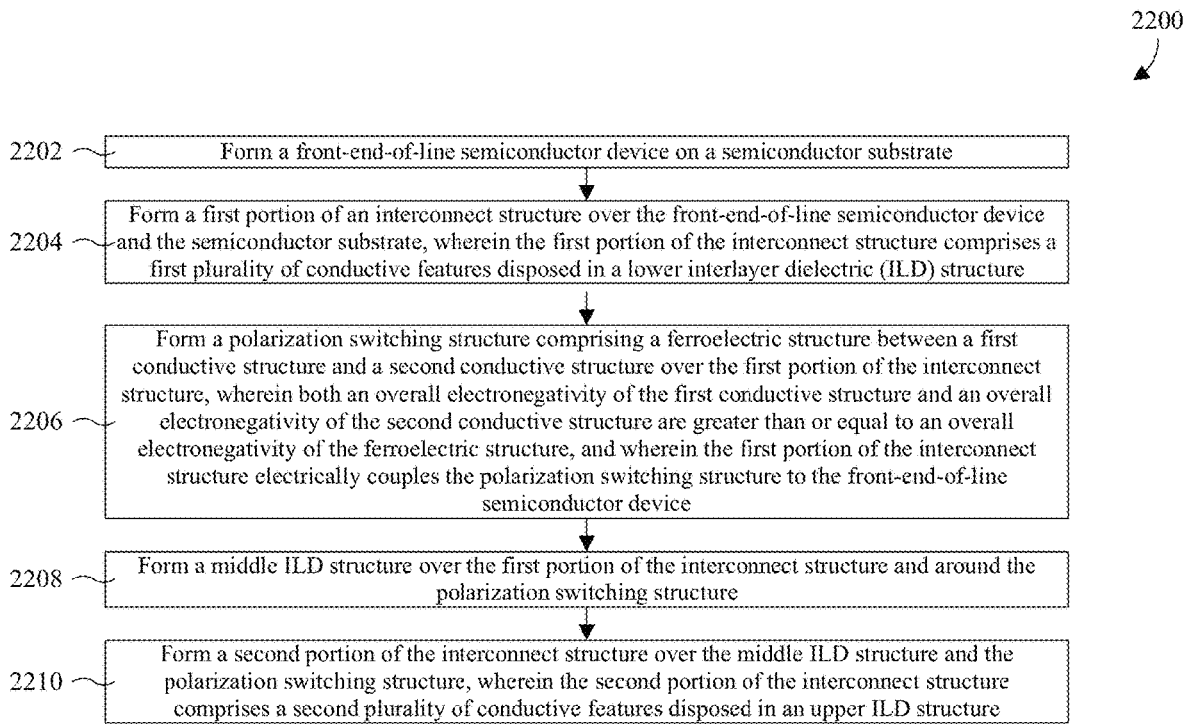
FIG. 22 illustrates a flowchart of some embodiments of a method for forming an IC comprising a back-end-of-line wakeup-free ferroelectric memory device.

FIG. 22 illustrates a flowchart 2200 of some embodiments of a method for forming an integrated chip (IC) comprising a back-end-of-line wakeup-free ferroelectric memory device. The back-end-of-line wakeup-free ferroelectric memory device may be the second wakeup-free ferroelectric memory device 101b. While the flowchart 2200 of FIG. 22 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2202, a front-end-of-line semiconductor device is formed on a semiconductor substrate.

In some embodiments, the front-end-of-line semiconductor device may be, for example, a metal-oxide semiconductor field-effect transistors (MOSFETs), bipolar junction transistors (BJTs), high-electron-mobility transistors (HEMTs), or any other front-end-of-line semiconductor device. In some embodiments, the front-end-of-line semiconductor device may be formed by process(es) substantially similar to process(es) described above regarding formation of the first wakeup-free ferroelectric memory device 101a (see, e.g., FIGS. 11-19). For example, the process(es) to form the isolation structure 104, the gate dielectric 108, the lightly-doped source/drain extensions 504a-b, the sidewall spacer 502, the source/drain regions 106a-b, and/or the gate electrode 118.

At act 2204, a first portion of an interconnect structure is formed over the front-end-of-line semiconductor device and the semiconductor substrate, where the first portion of the interconnect structure comprises a first plurality of conductive features disposed in a lower interlayer dielectric (ILD) structure.

In some embodiments, the first plurality of conductive features may be substantially similar to one or more of the plurality of conductive contacts 124, the plurality of conductive lines 402, and/or the plurality of conductive vias 404. In further embodiments, the lower ILD structure may be substantially similar to a portion of the ILD structure 122. In yet further embodiments, the first portion of the interconnect structure may be formed by process(es) substantially similar to process(es) described above regarding formation of the first ILD structure 122a, the second ILD structure 122b, the plurality of conductive contacts 124, the plurality of conductive lines 402, and/or the plurality of conductive vias 404 (see, e.g., FIG. 17 and/or FIG. 20).

At act 2206, a polarization switching structure comprising a ferroelectric structure between a first conductive structure and a second conductive structure is formed over the first portion of the interconnect structure, where both an overall electronegativity of the first conductive structure and an overall electronegativity of the second conductive structure are greater than or equal to an overall electronegativity of the ferroelectric structure, and where the first portion of the interconnect structure electrically couples the polarization switching structure to the front-end-of-line semiconductor device.

In some embodiments, the polarization switching structure 110 may be formed over the portion of the interconnect structure by process(es) substantially similar to process(es) described above regarding formation of the polarization switching structure 110 of the first wakeup-free ferroelectric memory device 101a (see, e.g., FIGS. 11-13). For example, the process(es) to form the first conductive structure 112, the ferroelectric structure 114, and/or the second conductive structure 116.

At act 2208, a middle ILD structure is formed over the first portion of the interconnect structure and around the polarization switching structure.

In some embodiments, the middle ILD structure may be substantially similar to a portion of the ILD structure 122. In further embodiments, the middle ILD structure may be formed by process(es) substantially similar to process(es) described above regarding formation of the first ILD structure 122a and/or the second ILD structure 122b (see, e.g., FIG. 17 and/or FIG. 20).

At act 2210, a second portion of the interconnect structure is formed over the middle ILD structure and the polarization switching structure, where the second portion of the interconnect structure comprises a second plurality of conductive features disposed in an upper ILD structure.

In some embodiments, the second plurality of conductive features may be substantially similar to one or more of the plurality of conductive contacts 124, the plurality of conductive lines 402, and/or the plurality of conductive vias 404. In further embodiments, the upper ILD structure may be substantially similar to a portion of the ILD structure 122. In yet further embodiments, the second portion of an interconnect structure may be formed by process(es) substantially similar to process(es) described above regarding formation of the first ILD structure 122a, the second ILD structure 122b, the plurality of conductive contacts 124, the plurality of conductive lines 402, and/or the plurality of conductive vias 404 (see, e.g., FIG. 17 and/or FIG. 20).

In some embodiments, the present application provides a ferroelectric memory device. The ferroelectric memory device comprises a pair of source/drain regions disposed in a semiconductor substrate. A gate dielectric is disposed over the semiconductor substrate and between the source/drain regions. A first conductive structure is disposed on the gate dielectric. A first ferroelectric structure is disposed on the first conductive structure. A second conductive structure is disposed on the ferroelectric structure, where both the first conductive structure and the second conductive structure have an overall electronegativity that is greater than or equal to an overall electronegativity of the ferroelectric structure.

In some embodiments, the present application provides an integrated chip (IC). The IC comprises a semiconductor device disposed on a semiconductor substrate. A first interlayer dielectric (ILD) structure is disposed over the semiconductor device and the semiconductor substrate. A first conductive via is disposed in the first ILD structure and electrically coupled to the semiconductor device. A polarization switching disposed over the first ILD structure and electrically coupled to the first conductive via, where the polarization switching structure comprises a ferroelectric structure disposed between a first conductive structure and a second conductive structure, and where both the first conductive structure and the second conductive structure have an overall electronegativity that is greater than or equal to an overall electronegativity of the ferroelectric structure In some embodiments, the present application provides a method for forming a ferroelectric memory device. The method comprises forming a dielectric layer over a semiconductor substrate. A first conductive layer is formed over the dielectric layer, where the first conductive layer has a first overall electronegativity. A ferroelectric layer is formed on the first conductive layer, where the ferroelectric layer has a second overall electronegativity that is less than or equal to the first overall electronegativity. A second conductive layer is formed on the ferroelectric layer, where the second conductive layer has a third overall electronegativity that is greater than or equal to the second electronegativity. The second conductive layer, the ferroelectric layer, and the first conductive layer are etched to from a polarization switching structure over the semiconductor substrate. A first conductive via is formed over the polarization switching structure and electrically coupled to the polarization switching structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric memory device, comprising:
a pair of source/drain regions disposed in a semiconductor substrate;
a gate dielectric disposed over the semiconductor substrate and between the source/drain regions;
a first conductive structure disposed on the gate dielectric;
a ferroelectric structure disposed on the first conductive structure;
a second conductive structure disposed on the ferroelectric structure, wherein both the first conductive structure and the second conductive structure have an overall electronegativity that is greater than or equal to an overall electronegativity of the ferroelectric structure;
a gate electrode disposed on the second conductive structure, wherein the gate electrode has a bottom surface disposed over the second conductive structure; and
a sidewall spacer disposed over the semiconductor substrate and extending vertically along a sidewall of the gate electrode, wherein the bottom surface of the gate electrode is disposed vertically between the semiconductor substrate and an upper surface of the sidewall spacer.

2. The ferroelectric memory device of claim 1, wherein the gate electrode has an overall electronegativity that is less than or equal to the overall electronegativity of the second conductive structure.

3. The ferroelectric memory device of claim 1, wherein the overall electronegativity of the first conductive structure is the same as the overall electronegativity of the second conductive structure.

4. The ferroelectric memory device of claim 1, wherein:
opposite outermost sidewalls of the first conductive structure are spaced apart by a first distance;
opposite outermost sidewalls of the ferroelectric structure are spaced apart by a second distance that is substantially the same as the first distance; and
opposite outermost sidewalls of the second conductive structure are spaced apart by a third distance that is substantially the same as the second distance.

5. The ferroelectric memory device of claim 4, wherein:
the second conductive structure has a first thickness between about 0.1 nanometers (nm) and about 1000 nm;
the first conductive structure has a second thickness between about 0.1 nm and about 1000 nm; and
the ferroelectric structure has a third thickness between about 1 nm and about 100 nm.

6. The ferroelectric memory device of claim 1, wherein the ferroelectric structure comprises a metal based oxide.

7. The ferroelectric memory device of claim 1, wherein a distance between a lower surface of the first conductive structure and an upper surface of the second conductive structure is greater than or equal to a distance between an upper surface of the gate dielectric and a lower surface of the gate dielectric.

8. The ferroelectric memory device of claim 1, wherein outer sidewalls of the gate electrode are substantially aligned with outer sidewalls of the second conductive structure.

9. An integrated chip (IC), comprising:
a first doped region disposed in a semiconductor substrate;
a second doped region disposed in the semiconductor substrate and laterally spaced from the first doped region, wherein the first doped region and the second doped region have a same doping type;
a gate dielectric structure disposed over the semiconductor substrate and between the first doped region and the second doped region;
a gate electrode structure disposed over the gate dielectric structure; and
a polarization switching structure disposed between the gate dielectric structure and the gate electrode structure, wherein:
the polarization switching structure comprises a first conductive structure, a second conductive structure, and a ferroelectric structure;
the ferroelectric structure separates the first conductive structure from the second conductive structure;
both the first conductive structure and the second conductive structure have an overall electronegativity that is greater than or equal to an overall electronegativity of the ferroelectric structure; and
a sidewall spacer disposed over the semiconductor substrate, wherein the sidewall spacer extends vertically along opposite sidewalls of the gate dielectric structure, vertically along opposite sidewalls of the first conductive structure, vertically along opposite sidewalls of the ferroelectric structure, vertically along opposite sidewalls of the second conductive structure, and vertically along opposite sidewalls of the gate electrode structure.

10. The IC of claim 9, wherein:
the polarization switching structure has a first thickness; and
the gate dielectric structure has a second thickness that is less than or equal to the first thickness.

11. The IC of claim 10, wherein a ratio of the first thickness to the second thickness is between 100/1 and 1/1.

12. The IC of claim 9, further comprising:
an interlayer dielectric (ILD) structure disposed over the semiconductor substrate, the gate dielectric structure, the polarization switching structure, and the gate electrode structure;
a conductive line disposed in the ILD structure and over the gate electrode structure; and
a conductive contact disposed in the ILD structure and between the gate electrode structure and the conductive line, wherein:
the conductive contact electrically couples the conductive line to the gate electrode structure;
the conductive line has a first thickness;
the polarization switching structure has a second thickness; and
a ratio of the first thickness to the second thickness is between 100/1 and 0.5/1.

13. The IC of claim 9, further comprising:
a first interlayer dielectric (ILD) structure disposed over the semiconductor substrate, wherein an upper surface of the first ILD structure, an upper surface of the sidewall spacer, and an upper surface of the gate electrode structure are co-planar.

14. The IC of claim 13, further comprising:
a second ILD structure disposed over the semiconductor substrate, the first ILD structure, the sidewall spacer, and the gate electrode structure;
a conductive line disposed in the second ILD structure and over the first ILD structure; and
a conductive contact disposed over the semiconductor substrate and in both the first ILD structure and the second ILD structure, wherein the conductive contact electrically couples the first doped region to the conductive line.

15. The IC of claim 9, wherein:
a length of the gate dielectric structure times a width of the gate dielectric structure equals an area of the gate dielectric structure;
a length of the first conductive structure times a width of the first conductive structure equals an area of the first conductive structure;
a length of the ferroelectric structure times a width of the ferroelectric structure equals an area of the ferroelectric structure;
a length of the second conductive structure times a width of the second conductive structure equals an area of the second conductive structure; and
the area of the gate dielectric structure is greater than or equal to the area of the first conductive structure, greater than or equal to the area of the ferroelectric structure, and greater than or equal to the area of the second conductive structure.

16. The IC of claim 15, wherein:
the area of the gate dielectric structure is between 1 square nanometer ($nm^2$) and 100 square micrometers ($um^2$);
the area of the first conductive structure is between 1 $nm^2$ and 100 $um^2$;
the area of the ferroelectric structure is between 1 $nm^2$ and 100 $um^2$; and
the area of the second conductive structure is between 1 $nm^2$ and 100 $um^2$.

17. The IC of claim 16, wherein:
the length of the gate dielectric structure, the length of the first conductive structure, the length of the ferroelectric structure, and the length of the second conductive structure are each between 1 nm and 10 um; and
the width of the gate dielectric structure, the width of the first conductive structure, the width of the ferroelectric structure, and the width of the second conductive structure are each between 1 nm and 10 um.

18. An integrated chip (IC), comprising:
a polarization switching structure disposed over a semiconductor substrate, wherein:
the polarization switching structure comprises a first conductive structure, a second conductive structure, and a ferroelectric structure;
the first conductive structure is disposed over the semiconductor substrate;
the ferroelectric structure is disposed on and overlies the first conductive structure; and
the second conductive structure is disposed on and overlies the ferroelectric structure; and
both the first conductive structure and the second conductive structure have an overall electronegativity that is greater than or equal to an overall electronegativity of the ferroelectric structure; and
a gate electrode structure disposed over the semiconductor substrate and the polarization switching structure, wherein the gate electrode structure has outer sidewalls that are substantially aligned with outer sidewalls of the second conductive structure.

19. The IC of claim 18, wherein the overall electronegativity of the first conductive structure is the same as the overall electronegativity of the second conductive structure.

20. The IC of claim 18, wherein the outer sidewalls of the gate electrode structure are substantially aligned with outer sidewalls of the ferroelectric structure.

* * * * *